(12) United States Patent
Onozaki et al.

(10) Patent No.: US 11,563,403 B2
(45) Date of Patent: Jan. 24, 2023

(54) COATING MATERIAL, COVER GLASS, SOLAR CELL MODULE AND OUTER WALL MATERIAL FOR BUILDING

(71) Applicants: AGC Inc., Chiyoda-ku (JP); AGC GLASS EUROPE, Louvain-la-Neuve (BE)

(72) Inventors: Yu Onozaki, Chiyoda-ku (JP); Tomohiro Sakai, Chiyoda-ku (JP); Shun Saito, Chiyoda-ku (JP); Noriyoshi Kayaba, Chiyoda-ku (JP); Aichi Inoue, Chiyoda-ku (JP); Tetsuji Irie, Chiyoda-ku (JP)

(73) Assignees: AGC Inc., Chiyoda-ku (JP); AGC GLASS EUROPE, Louvain-la-Neuve (BE)

( * ) Notice: Subject to any disclaimer, the term of this patent is extended or adjusted under 35 U.S.C. 154(b) by 2 days.

(21) Appl. No.: 16/892,520

(22) Filed: Jun. 4, 2020

(65) Prior Publication Data

US 2020/0295705 A1    Sep. 17, 2020

Related U.S. Application Data

(63) Continuation of application No. PCT/JP2018/043278, filed on Nov. 22, 2018.

(30) Foreign Application Priority Data

Dec. 11, 2017  (JP) .............................. JP2017-236991
Mar. 13, 2018  (JP) .............................. JP2018-045416
Mar. 13, 2018  (JP) .............................. JP2018-045508

(51) Int. Cl.
*H02S 40/22* (2014.01)
*H01L 31/048* (2014.01)
(Continued)

(52) U.S. Cl.
CPC ................ *H02S 40/22* (2014.12); *C03C 8/04* (2013.01); *C03C 8/14* (2013.01); *C03C 17/007* (2013.01);
(Continued)

(58) Field of Classification Search
None
See application file for complete search history.

(56) References Cited

U.S. PATENT DOCUMENTS 2,774,703 A  * 12/1956  Reynolds .................... C08J 5/06
                                                442/149
6,294,722 B1 *  9/2001  Kondo ................... H01L 31/048
                                                136/258
(Continued)

FOREIGN PATENT DOCUMENTS

CN       102770498 A     11/2012
CN       104981860 A     10/2015
(Continued)

OTHER PUBLICATIONS

Darden et al., New Waterborne Fluoropolymer Resins for Ultra-Weatherable Coatings, JPCL Dec. 2009, 32-37 (Year: 2009).*
(Continued)

*Primary Examiner* — Shannon M Gardner
(74) *Attorney, Agent, or Firm* — Oblon, McClelland, Maier & Neustadt, L.L.P.

(57) ABSTRACT

To provide a coating material capable of forming a solar cell module excellent in the weather resistance, the power generation efficiency and the design, a cover glass, a solar cell module comprising the cover glass, and an outer wall material for building. The cover glass of the present invention is a cover glass comprising a glass plate and a layer containing a fluorinated polymer having units based on a fluoroolefin, on at least one surface of the glass plate, which (Continued)

has an average visible reflectance of from 10 to 100%, and an average near infrared transmittance of from 20 to 100%.

19 Claims, 2 Drawing Sheets

(51) Int. Cl.

| | | |
|---|---|---|
| H01L 31/054 | (2014.01) | |
| C09D 7/61 | (2018.01) | |
| C03C 17/00 | (2006.01) | |
| C03C 17/04 | (2006.01) | |
| C03C 17/30 | (2006.01) | |
| C03C 17/32 | (2006.01) | |
| C09D 5/00 | (2006.01) | |
| C09D 127/12 | (2006.01) | |
| H01L 31/032 | (2006.01) | |
| H02S 20/26 | (2014.01) | |
| C03C 8/04 | (2006.01) | |
| C03C 8/14 | (2006.01) | |
| C09D 183/06 | (2006.01) | |

(52) U.S. Cl.
CPC ............ *C03C 17/009* (2013.01); *C03C 17/04* (2013.01); *C03C 17/30* (2013.01); *C03C 17/32* (2013.01); *C09D 5/00* (2013.01); *C09D 7/61* (2018.01); *C09D 127/12* (2013.01); *C09D 183/06* (2013.01); *H01L 31/0322* (2013.01); *H01L 31/048* (2013.01); *H01L 31/0481* (2013.01); *H01L 31/054* (2014.12); *C03C 2207/00* (2013.01); *C03C 2217/445* (2013.01); *C03C 2217/475* (2013.01); *C03C 2217/485* (2013.01); *C03C 2218/113* (2013.01); *H02S 20/26* (2014.12)

(56) References Cited

U.S. PATENT DOCUMENTS

| | | | | |
|---|---|---|---|---|
| 2002/0006425 | A1* | 1/2002 | Takaoka | ................ B01J 35/004 424/405 |
| 2012/0270986 | A1 | 10/2012 | Maruyama et al. | |
| 2017/0240747 | A1 | 8/2017 | Constantz et al. | |

FOREIGN PATENT DOCUMENTS

| | | | | |
|---|---|---|---|---|
| JP | 2001-53315 | A | 2/2001 | |
| JP | 2007-123725 | A | 5/2007 | |
| JP | 2012-33843 | A | 2/2012 | |
| JP | 2012-84820 | A | 4/2012 | |
| WO | WO-8603885 | A1 * | 7/1986 | ............ B29C 66/45 |
| WO | WO 97/27150 | A1 | 7/1997 | |
| WO | WO 2017/089196 | A1 | 6/2017 | |
| WO | WO 2018/216718 | A1 | 11/2018 | |

OTHER PUBLICATIONS

International Search Report dated Aug. 14, 2018 in PCT/JP2018/019791 filed May 23, 2018, 2 pages.
U.S. Appl. No. 16/676,498, filed Nov. 7, 2019, 2020/0075787 A1, Tomohiro Sakai et al.

* cited by examiner

COATING MATERIAL, COVER GLASS, SOLAR CELL MODULE AND OUTER WALL MATERIAL FOR BUILDING

TECHNICAL FIELD

The present invention relates to a coating material, a cover glass, a solar cell module and an outer wall material for building.

BACKGROUND ART

Buildings on the rooftop or the roof of which solar cell arrays are installed are increasing. Particularly for zero emission buildings, it is important to secure the power generation amount. The energy consumption increases as the building becomes taller, whereas the area of the rooftop or the roof of the building does not change, and accordingly it has been studied to install solar cell arrays on a wall surface or windows of a building.

Patent Document 1 discloses a solar cell module having an anti-glare film containing a fluorinated polymer, silica and the like, to prevent reflection of sunlight.

PRIOR ART DOCUMENTS

Patent Documents

Patent Document 1: JP-A-2001-053315

DISCLOSURE OF INVENTION

Technical Problem

The present inventors have evaluated the solar cell module having a film containing a fluorinated polymer, silica and the like as disclosed in Patent Document 1 and found that although it is excellent in the weather resistance and the power generation efficiency, it has such a problem that solar cells are visually recognized when the solar cell module is observed from the film side. Specifically, in a case where the solar cell module is installed on a wall surface, windows or the like on a building, the outer appearance design of the building or the like is influenced and the building is inferior in the design, by the solar cells being visually recognized.

On the other hand, if solar cells are shielded e.g. by a colored cover glass so as to improve the design of the solar cell module, depending upon the type of the cover glass, light having a wavelength which is necessary for power generation does not reach the solar cells, and the solar cell module is inferior in the power generation efficiency.

As mentioned above, in the solar cell module, to achieve a power generation efficiency and to achieve the design conflict with each other.

Under these circumstances, it is an object of the present invention to provide a coating material capable of forming a solar cell module excellent in the weather resistance, the power generation efficiency and the design, a cover glass, a solar cell module comprising the cover glass, and an outer wall material for building.

Solution to Problem

The present inventors have conducted extensive studies to achieve the above object and as a result, by applying a cover glass having an average visible reflectance and an average near infrared transmittance within preferred ranges to a solar cell module, the desired effects can be obtained, and they have accomplished the present invention.

That is, the present inventors have found that the above objects can be achieved by the following constitutions.

[1] A cover glass comprising a glass plate and a layer covering at least one surface of the glass plate, the layer containing a fluorinated polymer having units based on a fluoroolefin,
wherein the cover glass has an average visible reflectance of from 10 to 100%, which is an arithmetic mean of reflectances at 5 nm intervals in a visible region at a wavelength of from 380 to 780 nm, and the cover glass has an average near infrared transmittance of from 20 to 100%, which is an arithmetic mean of transmittances at 5 nm intervals in a near infrared region at a wavelength of from 780 to 1,500 nm.

[2] The cover glass according to [1], which has an average visible transmittance of less than 70%, which is an arithmetic mean of transmittances at 5 nm intervals in a visible region at a wavelength of from 380 to 780 nm.

[3] The cover glass according to [1] or [2], which has a maximum reflectance of from 20 to 100% among reflectances at wavelengths at 5 nm intervals in a visible region at a wavelength of from 380 to 780 nm.

[4] The cover glass according to any one of [1] to [3], wherein the glass plate contains no $Fe_2O_3$ or if it contains $Fe_2O_3$, it has a $Fe_2O_3$ content (a content of total iron contained in the glass plate as calculated as $Fe_2O_3$) of at most 0.3 mass % to the total mass of the glass plate.

[5] The cover glass according to any one of [1] to [4], wherein the layer further contains inorganic particles, and the layer has a content of the inorganic particles of from 10 to 1,000 parts by mass per 100 parts by mass of the fluorinated polymer.

Further, preferred is the cover glass according to [5] wherein the inorganic particles are particles having a volume-based cumulative 50% diameter of from 2 to 2,000 μm.

[6] The cover glass according to [5], wherein the inorganic particles are particles of an inorganic pigment having a maximum near infrared reflectance in a near infrared region at a wavelength of from 780 to 1,500 nm of at least 50%, an average particle size of from 5.0 to 280.0 nm and a specific surface area of from 5.0 to 1,000 $m^2/g$.

[7] The cover glass according to [6], wherein the inorganic pigment has in the L*a*b* color space an L* value of from 5 to 100, an a* value of from −60 to 60, and a b* value of from −60 to 60.

Further, preferred is a cover glass according to any one of [1] to [4], wherein the layer is a layer containing an organic pigment having a maximum near infrared reflectance in a near infrared region at a wavelength of from 780 to 1,500 nm of at least 50%, an average particle size of from 5.0 to 280.0 nm, and a specific surface area of from 5.0 to 1,000 $m^2/g$.

[8] The cover glass according to any one of [1] to [7], wherein the fluorinated polymer has a fluorine atom content of from 15 to 30 mass %.

Further, preferred is the cover glass according to any one of [1] to [8], wherein the fluorinated polymer has a crosslinked structure.

[9] The cover glass according to any one of [1] to [8], wherein the fluorinated polymer is a fluorinated polymer having a crosslinked structure formed by reaction of a copolymer having units based on a fluoroolefin and units having a crosslinkable group, and a curing agent capable of crosslinking the crosslinkable groups, and
the curing agent is a compound having in one molecule at least two groups of at least one type selected from the group consisting of an isocyanate group, a blocked isocyanate group, an epoxy group, a carbodiimide group, an oxazoline group, a β-hydroxyalkylamide group, a hydrolysable silyl group and a silanol group.

Further, preferred is the cover glass according to any one of [1] to [9], wherein the layer has an average layer thickness of from 1 to 3,000 μm.

Further, preferred is the cover glass according to any one of [1] to [9], wherein the glass plate has an average plate thickness of from 1 to 30 mm.

[10] The cover glass according to any one of [1] to [9], which is a cover glass for a solar cell module.

[11] A solar cell module, comprising solar cells and the cover glass as defined in any one of [1] to [10], as a cover glass on a light-receiving surface side of the solar cells.

[12] An outer wall material for building, comprising the solar cell module as defined in [11].

[13] A coating material comprising a fluorinated polymer having units based on a fluoroolefin and at least one pigment selected from an organic pigment and an inorganic pigment, wherein the pigment has a maximum near infrared reflectance in a near infrared region at a wavelength of from 780 to 1,500 nm of at least 50%, an average particle size of from 5.0 to 280.0 nm and a specific surface area of from 5.0 to 1,000 $m^2/g$.

Further, preferred is the coating material according to [13], which further contains an organic solvent, and has the fluorinated polymer dissolved in the organic solvent.

Further, preferred is the coating material according to [13], which further contains a dispersing agent.

[14] The coating material according to [13], wherein the fluorinated polymer has a fluorine atom content of from 15 to 30 mass %.

[15] The coating material according to [13] or [14], for forming a layer constituting a cover glass for a solar cell module, the cover glass having an average visible reflectance of from 10 to 100%, which is an arithmetic mean of reflectances at 5 nm intervals in a visible region at a wavelength of from 380 to 780 nm, and an average near infrared transmittance of from 20 to 100%, which is an arithmetic mean of transmittances at 5 nm intervals in a near infrared region at a wavelength of from 780 to 1,500 nm.

[16] A method for producing a cover glass comprising a glass plate and a layer containing a fluorinated polymer having units based on a fluoroolefin, on at least one surface of the glass plate, the method comprising applying to a glass plate, a coating material containing a fluorinated polymer having units based on a fluoroolefin and a colored inorganic pigment having a maximum near infrared reflectance in a near infrared region at a wavelength of from 780 to 1,500 nm of at least 50%, an average particle size of from 5.0 to 280.0 nm and a specific surface area of from 5.0 to 1,000 $m^2/g$, wherein the cover glass has an average visible reflectance of from 10 to 100%, which is an arithmetic mean of reflectances at 5 nm intervals in a visible region at a wavelength of from 380 to 780 nm, and an average near infrared transmittance of from 20 to 100%, which is an arithmetic mean of transmittances at 5 nm intervals in a near infrared region at a wavelength of from 780 to 1,500 nm.

Advantageous Effects of Invention

According to the present invention, it is possible to provide a coating material capable of forming a solar cell module excellent in the weather resistance, the power generation efficiency and the design, a cover glass, a solar cell module comprising the cover glass, and an outer wall material for building. Particularly, by applying the cover glass of the present invention to a solar cell module comprising solar cells having high spectral sensitivity to infrared light, an excellent solar cell module having both the design and the power generation efficiency achieved can be obtained.

DESCRIPTION OF EMBODIMENTS

Figure 1:
FIG. 1 is a cross-sectional view schematically illustrating an example of a cover glass of the present invention.

The meanings of the terms in the present invention are as follows.

A unit generally means an atomic group based on one monomer molecule directly formed by polymerization of the monomer, and an atomic group obtained by chemical conversion of a part of the atomic group. The content (mol %) of each units to all the units in a polymer is obtained by analyzing the polymer by nuclear magnetic resonance (NMR) spectroscopy.

A (meth)acrylate generally means an acrylate and a methacrylate, and (meth)acrylic generally means acrylic and methacrylic.

A hydrolyzable silyl group is a group to be converted to a silanol group by hydrolysis.

The fluorine atom content in a fluorinated polymer means the proportion (mass %) of fluorine atoms to all the atoms constituting the fluorinated polymer. The fluorine atom content is obtained by analyzing the fluorinated polymer by nuclear magnetic resonance (NMR) spectroscopy.

The fluorine atom content in a layer means the content (mass %) of fluorine atoms to all the atoms constituting the layer. The fluorine atom content in the layer is obtained by measurement of the layer by automatic quick furnace combustion ion chromatography (AQF-IC) under the following conditions.

<Analytical Conditions>
Automatic quick furnace combustion apparatus
 Apparatus: manufactured by Mitsubishi Chemical Analytech Co., Ltd., automatic quick furnace combustion apparatus AQF-100
 Combustion conditions: solid sample mode
 Sample amount: 2 to 20 mg
Ion chromatograph
 Apparatus: manufactured by Thermo Fischer SCIENTIFIC
 Column: Ionpac AG11HC+Ionpac AS11HC
 Eluent: KOH 10 mN (0 to 9 min), 10 to 16 mN (9 to 11 min), 16 mN (11 to 15 min), 16 to 61 mN (15 to 20 min), 60 mN (20 to 25 min)
 Flow rate: 1.0 mL/min
 Suppressor: ASRS
 Detector: conductance detector
 Amount injected: 5 μL The acid value and the hydroxy value are respectively values measured in accordance with JIS K0070-3 (1992).

The mass of the solid content in the coating material is the mass, in a case where the coating material contains a solvent, after the solvent is removed from the coating material. The mass of the solid content in the composition is obtained as the mass remaining after the composition is heated at 130° C. for 20 minutes.

The layer thickness is properly measured by using a film thickness meter, and in Examples, it is a value measured by an eddy-current instrument for measuring thickness (trade name "EDY-5000" manufactured by SANKO ELECTRONIC LABORATORY CO., LTD.).

The average visible reflectance, the maximum visible reflectance, the average visible transmittance, the maximum visible transmittance and the average near infrared transmittance are values calculated from the reflectance or the transmittance measured by using a spectrophotometer, setting the cover glass so that light enters from the normal direction of the surface of the layer containing the fluorinated polymer.

By using the cover glass of the present invention, it is possible to form a solar cell module excellent in the weather resistance, the power generation efficiency and the design, which is estimated to be due to the following reasons.

By using the cover glass having an average visible reflectance of at least 10%, reflected light which entered the cover glass is likely to be detected by human eyes. That is, colors or patterns imparted to the cover glass are visually recognized, whereas the solar cells are hardly visually recognized. Thus, it is estimated that a solar cell module excellent in the design will be obtained.

Further, it is estimated that a solar cell module having excellent power generation efficiency is obtained by using a cover glass having an average near infrared transmittance of at least 20%, whereby near infrared light is likely to reach the light-receiving surface of solar cells. Particularly in a case where solar cells having high spectral sensitivity to light in a near infrared region are used, use of the cover glass of the present invention is suitable.

Further, it is estimated that a solar cell module excellent in the weather resistance can be obtained since the layer on at least one surface of the glass plate constituting the cover glass contains a fluorinated polymer.

Now, an example of the cover glass of the present invention and a solar cell module comprising the cover glass of the present invention will be described with reference to drawings. The cover glass of the present invention will sometimes be referred to as the present cover glass, and a solar cell module comprising the cover glass of the present invention will sometimes be referred as the present solar cell module.

FIG. 1 is a cross-sectional view schematically illustrating an example of the present cover glass.

As shown in FIG. 1, a cover glass 14 comprises a glass plate 114 and a layer 214 containing a fluorinated polymer having units based on a fluoroolefin, on the glass plate 114.

The glass plate in the present invention may be made of e.g. soda lime silicate glass, quartz glass, crystal glass, alkali-free glass, aluminosilicate glass, borosilicate glass or barium borosilicate glass, and in view of high transparency, preferably made of soda lime silicate glass.

The soda lime silicate glass may, for example, be specifically glass having a composition comprising, as calculated as oxides, from 60 to 75 mass % of $SiO_2$, from 0 to 3 mass % of $Al_2O_3$, more than 0 and at most 15 mass % of CaO, from 0 to 12 mass % of MgO and from 5 to 20 mass % of $Na_2O$. Here, $SiO_2$ is the main component of the soda lime silicate glass.

Soda lime silicate glass may further contain, in addition to the above components, at least one material selected from the group consisting of $K_2O$, $TiO_2$, $ZrO_2$ and $LiO_2$.

Further, the soda lime silicate glass may further contain a clarifying agent (such as $SO_3$, $SnO_2$ or $Sb_2O_3$).

The glass plate may be a tempered glass plate having tempering treatment applied thereto. A tempered glass plate is preferred since it is hardly broken as compared with a glass plate having no tempering treatment applied thereto. As a tempered glass plate, for example, a glass plate having a front layer having residual compressive stress, a rear layer having residual compressive stress, and an interlayer having residual tensile stress formed between the front layer and the rear layer, is used.

The tempering treatment may, for example, be specifically chemical tempering treatment carried out e.g. by known ion exchange method or physical tempering treatment carried out e.g. by known air-cooling tempering method. A chemically tempered glass plate has sufficient strength even if the glass plate has a small plate thickness, since the front layer or the rear layer has large residual compressive stress.

The glass plate may be surface-treated in view of the adhesion to the layer. The surface treatment method may be a known method, such as activation treatment (plasma method, deposition method, acid treatment or base treatment), chemical conversion, polishing of the material surface, sander treatment, sealing treatment, blasting treatment or primer treatment, and is preferably primer treatment (particularly application of a primer agent).

The primer agent may, for example, be a silane coupling agent (particularly an alkoxysilane or the like), a titanium coupling agent, an epoxy resin, a (meth)acrylic resin or a polyester resin. Since the material to be surface-treated is a glass plate, the primer agent is preferably a silane coupling agent or a titanium coupling agent, particularly preferably a silane coupling agent. By using a glass plate surface-treated with a silane coupling agent or a titanium coupling agent, even when the after-described coating material is applied to at least one surface of the glass plate to form a layer, excellent adhesion between the glass plate and the layer will be achieved.

The silane coupling agent is, in view of the adhesion between the glass plate and the layer and the durability, preferably a compound having from 3 to 4 alkoxy groups or isocyanate groups as hydrolyzable groups and from 0 to 1 non-hydrolyzable group bonded to a silicon atom. The non-hydrolyzable group is preferably an alkyl group which may have a functional group, and the functional may, for example, be an amino group, an isocyanate group, a hydroxy group or an epoxy group.

The silane coupling agent may, for example, be specifically 3-isocyanatopropyltrialkoxysilane, 3-aminopropyltrialkoxysilane, methyltriisocyanatosilane or tetraisocyanatosilane, and as commercial products, ORGATIX SI-310, SI-400, manufactured by Matsumoto Fine Chemical Co., Ltd. may, for example, be used.

The titanium coupling agent is, in view of the adhesion between the glass plate and the layer and the durability, preferably an alkoxy titanium ester, titanium chelate or titanium acylate, more preferably an alkoxy titanium ester derivative containing a titanium oligomer. The titanium coupling agent is particularly preferably a compound represented by $(RO)_x(TiO)_{y/2}$ (wherein X and Y are each independently a positive integer). As commercial products, ORGATIX PC-620 and PC-601 manufactured by Matsumoto Fine Chemical Co., Ltd. may, for example, be used.

The glass plate contains no $Fe_2O_3$, or if the glass plate contains $Fe_2O_3$, it has a $Fe_2O_3$ content of preferably at most 0.3 mass %, more preferably at most 0.1 mass %, particularly preferably at most 0.03 mass % to the total mass of the glass plate. When the $Fe_2O_3$ content is at most 0.3 mass %, absorption of near infrared light by $Fe_2O_3$ can be suppressed, whereby the power generation efficiency will improve. Accordingly, a cover glass comprising a glass plate having a $Fe_2O_3$ content of at most 0.3 mass % is suitable for a solar cell module comprising solar cells having high spectral sensitivity to near infrared light.

The $Fe_2O_3$ content in this specification means a content of total iron contained in the glass plate as calculated as $Fe_2O_3$, and is obtained by fluorescent X-ray measurement method.

The average glass plate thickness is optionally set depending upon e.g. the designed wind pressure of a building. The average glass plate thickness is preferably at least 1 mm, more preferably at least 2 mm, particularly preferably at least 3 mm. The average plate thickness of the glass plate is preferably at most 30 mm, more preferably at most 20 mm, particularly preferably at most 15 mm. Accordingly, the average glass plate thickness is preferably from 1 to 30 mm, more preferably from 3 to 20 mm, particularly preferably from 3 to 15 mm. When the average plate thickness is at least 1 mm, the glass plate has high durability, and the present cover glass is hardly broken. When the average plate thickness is at most 30 mm, the present cover glass is light in weight, and the present solar cell module is more suitably used for a wall surface or windows of a building.

The average glass plate thickness is an arithmetic mean of plate thicknesses measured by a thickness meter.

The layer in the present invention is a layer containing a fluorinated polymer having units based on a fluoroolefin (hereinafter sometimes referred to as units F) or its cured product.

The layer may be formed, for example, by using a coating material containing a fluorinated polymer.

A fluoroolefin is an olefin having at least one hydrogen atom substituted by a fluorine atom. In the fluoroolefin, at least one hydrogen atom not substituted by a fluorine atom may be substituted by a chlorine atom.

The fluoroolefin may, for example, be specifically $CF_2=CF_2$, $CF_2=CFCl$, $CF_2=CHF$, $CH_2=CF_2$, $CF_2=CFCF_3$, $CF_2=CHCF_3$, $CF_3CH=CHF$, $CF_3CF=CH_2$ or a monomer represented by $CH_2=CX^{f1}(CF_2)_{n1}Y^{f1}$ (wherein $X^{f1}$ and $Y^{f1}$ are each independently a hydrogen atom or a fluorine atom, and n1 is an integer of from 2 to 10). The fluoroolefin is, in view of excellent weather resistance of the present solar cell module, preferably $CF_2=CF_2$, $CH_2=CF_2$, $CF_2=CFCl$, $CF_3CH=CHF$ or $CF_3CF=CH_2$, particularly preferably $CF_2=CFCl$. The fluoroolefin may be used in combination of two or more.

The fluorinated polymer may have only units F, may have units F and units based on a monomer containing a fluorine atom other than the fluoroolefin, or may have units F and units based on a monomer containing no fluorine atom.

The fluorinated polymer having only units F may, for example, be a homopolymer of the fluoroolefin or a copolymer of at least two types of fluoroolefin, specifically, polytetrafluoroethylene, polychlorotrifluoroethylene, a tetrafluoroethylene/hexafluoropropylene copolymer or polyvinylidene fluoride.

The fluorinated polymer having units F and units based on a monomer containing a fluorine atom other than the fluoroolefin may, for example, be a fluoroolefin/perfluoro(alkyl vinyl ether) copolymer, specifically, a tetrafluoroethylene/perfluoro(alkyl vinyl ether) copolymer.

The content of the units F is, in view of the weather resistance of the present solar cell module, preferably from 20 to 100 mol %, more preferably from 30 to 80 mol %, particularly preferably from 40 to 60 mol %, to all the units contained in the fluorinated polymer.

The fluorinated polymer preferably has units based on a fluoroolefin and units based on a monomer containing no fluorine atom, in view of the design of the present cover glass and easiness of adjustment of the transmittances and the reflectances of light at the respective wavelengths. The units based on a monomer containing no fluorine atom may, for example, be units having a crosslinkable group or units having no crosslinkable group.

The fluorinated polymer having the units F and the units based on a monomer containing no fluorine atom may, for example, be a chlorotrifluoroethylene/vinyl ether copolymer, a chlorotrifluoroethylene/vinyl ether/vinyl ester copolymer, a chlorotrifluoroethylene/vinyl ester/allyl ether copolymer, a tetrafluoroethylene/vinyl ester copolymer, a tetrafluoroethylene/vinyl ester/allyl ether copolymer or an ethylene/tetrafluoroethylene copolymer, and in view of the design of the present solar cell module, preferably a chlorotrifluoroethylene/vinyl ether copolymer.

The fluorinated polymer preferably has, in view of the durability of the layer, as the units based on a monomer containing no fluorine atom, units having a crosslinkable group (hereinafter sometimes referred to as units (1)). The units (1) may be units based on a monomer having a crosslinkable group (hereinafter sometimes referred to as a monomer (1)) or may be units obtained by converting crosslinkable groups of a fluorinated polymer having units (1) to different crosslinkable groups. Such units may be units obtained by reacting a fluorinated polymer having units having a hydroxy group with a polycarboxylic acid or its acid anhydride or the like to convert one or more or all of the hydroxy groups to carboxy groups. The crosslinkable group may, for example, be specifically a hydroxy group, a carboxy group, an amino group, an epoxy group or a hydrolyzable silyl group, and is preferably a hydroxy group or a carboxy group in view of more improved strength of the layer.

The crosslinkable group which the unit (1) has may be crosslinked by the after-described curing agent in the layer, or may remain without being crosslinked. The fluorinated polymer in the layer is preferably reacted with the curing agent and crosslinked. When the crosslinkable group which the unit (1) has is crosslinked by the curing agent, the layer is more excellent in durability. When the crosslinkable group which the unit (1) has remains without being crosslinked, the dispersibility of the inorganic pigment in the layer is more excellent.

The monomer (1) having a carboxy group may, for example, be an unsaturated carboxylic acid, a (meth)acrylic acid, or a monomer obtained by reacting the hydroxy group of the monomer having a hydroxy group with a carboxylic anhydride. The monomer (1) having a carboxy group is preferably a monomer represented by $X^{11}$-$Y^{11}$ (hereinafter sometimes referred to as monomer (11)).

Symbols in the formula have the following meanings.

$X^{11}$ is $CH_2=CH-$, $CH(CH_3)=CH-$ or $CH_2=C(CH_3)-$, preferably $CH_2=CH-$ or $CH(CH_3)=CH-$.

$Y^{11}$ is a carboxy group or a $C_{1-12}$ monovalent saturated hydrocarbon group having a carboxy group, preferably a carboxy group or a $C_{1-10}$ carboxy alkyl group.

The monomer (1) having a hydroxy group may, for example, be a vinyl ether, a vinyl ester, an allyl ether, an allyl ester, a (meth)acrylate or an allyl alcohol, each having a hydroxy group. The monomer (1) having a hydroxy group is preferably a monomer represented by $X^{12}$—$Y^{12}$ (hereinafter sometimes referred to as monomer (12)) or allyl alcohol.

$X^{12}$ is $CH_2$=CHO—, $CH_2$=CHCH$_2$O—, $CH_2$=CHCOO— or $CH_2$=C(CH$_3$)COO—.

$Y^{12}$ is a $C_{2-12}$ monovalent saturated hydrocarbon group having a hydroxy group. The monovalent saturated hydrocarbon group may be linear or branched. Further, the monovalent saturated hydrocarbon group may be cyclic or may contain a cyclic structure.

The monovalent saturated hydrocarbon group is preferably a $C_{2-6}$ alkyl group or an alkyl group containing a $C_{6-8}$ cycloalkylene group.

The monomer (11) may, for example, be specifically $CH_2$=CHCOOH, CH(CH$_3$)=CHCOOH, $CH_2$=C(CH$_3$)COOH, or a compound represented by $CH_2$=CH(CH$_2$)$_{n2}$COOH (wherein n2 is an integer of from 1 to 10).

The monomer (12) may, for example, be specifically $CH_2$=CHO—$CH_2$-cyclo $C_6H_{10}$—$CH_2$OH, $CH_2$=CHCH$_2$O—$CH_2$-cyclo $C_6H_{10}$—$CH_2$OH, $CH_2$=CHOCH$_2$CH$_2$OH, $CH_2$=CHCH$_2$OCH$_2$CH$_2$OH, $CH_2$=CHOCH$_2$CH$_2$CH$_2$CH$_2$OH, $CH_2$=CHCH$_2$OCH$_2$CH$_2$CH$_2$OH, $CH_2$=CHCOOCH$_2$CH$_2$OH, or $CH_2$=C(CH$_3$)COOCH$_2$CH$_2$OH. "-cyclo $C_6H_{10}$—" represents a cyclohexylene group, and the binding position of "-cyclo $C_6H_{10}$—" is usually 1,4-position.

The monomer (1) may be used in combination of two or more. Further, the monomer (1) may have at least two types of crosslinkable group.

The content of the units (1) is preferably from 0.5 to 35 mol %, more preferably from 3 to 25 mol %, further preferably from 5 to 25 mol %, particularly preferably from 5 to 20 mol %, to all the units contained in the fluorinated polymer.

The fluorinated polymer preferably has a crosslinked structure, whereby the strength of the layer improves. Specifically, in a case where the fluorinated polymer has the units (1), the crosslinkable groups of the units (1) are preferably crosslinked e.g. by the after-described curing agent to form a crosslinked structure.

That is, the fluorinated polymer in this specification may include both a state where crosslinkable groups remain and a state where crosslinkable groups are crosslinked e.g. by a curing agent.

The fluorinated polymer preferably further has, as the units based on a monomer containing no fluorine atom, units based on a monomer having no crosslinkable group. The units based on a monomer having no crosslinkable group are preferably units (hereinafter sometimes referred to as units (2)) based on at least one monomer (hereinafter sometimes referred to as a monomer (2)) selected from the group consisting of a vinyl ether, a vinyl ester, an allyl ether, an allyl ester and a (meth)acrylate.

The units (2) are preferably units based on a monomer represented by $X^2$—$Y^2$.

$X^2$ is $CH_2$=CHC(O)O—, $CH_2$=C(CH$_3$)C(O)O—, $CH_2$=CHOC(O)—, $CH_2$=CHCH$_2$OC(O)—, $CH_2$=CHO— or $CH_2$=CHCH$_2$O—, and in view of excellent weather resistance of the present solar cell module, preferably $CH_2$=CHOC(O)—, $CH_2$=CHCH$_2$OC(O)—, $CH_2$=CHO— or $CH_2$=CHCH$_2$O—.

$Y^2$ is a $C_{1-24}$ monovalent hydrocarbon group. The monovalent hydrocarbon group may be linear or branched. Further, the monovalent hydrocarbon group may be cyclic or may contain a cyclic structure. Further, the monovalent hydrocarbon group may be a monovalent saturated hydrocarbon group or may be a monovalent unsaturated hydrocarbon group.

The monovalent hydrocarbon group is preferably an alkyl group, a cycloalkyl group, an aryl group or an aralkyl group, particularly preferably a $C_{2-12}$ alkyl group, a $C_{6-10}$ cycloalkyl group, a $C_{6-10}$ aryl group or a $C_{7-12}$ aralkyl group.

The alkyl group may, for example, be specifically a methyl group, an ethyl group, a tert-butyl group, a hexyl group, a nonyl group, a decyl group or a dodecyl group.

The cycloalkyl group may, for example, be a cyclohexyl group.

The aralkyl group may, for example, be specifically a benzyl group.

The aryl group may, for example, be specifically a phenyl group or a naphthyl group.

The hydrogen atom in each of the cycloalkyl group, the aryl group and the aralkyl group may be substituted by an alkyl group. In such a case, the number of carbon atoms of the alkyl group as the substituent is not included in the number of carbon atoms of the cycloalkyl group or the aryl group.

The monomer (2) may be used in combination of two or more.

The monomer (2) may, for example, be specifically ethyl vinyl ether, tert-butyl vinyl ether, 2-ethylhexyl vinyl ether, cyclohexyl vinyl ether, vinyl acetate, vinyl pivalate, vinyl neononanoate (manufactured by HEXION, trade name "VeoVa 9"), vinyl neodecanoate (manufactured by HEXION, trade name "VeoVa 10"), vinyl benzoate, vinyl tert-butylbenzoate, tert-butyl (meth)acrylate or benzyl (meth)acrylate.

The content of the units (2) is preferably from 5 to 60 mol %, particularly preferably from 10 to 50 mol % to all the units contained in the fluorinated polymer.

As the fluorinated polymer, commercial products may be used, specific examples of which include "LUMIFLON" series (trade name by AGC Inc.), "Kynar" series (trade name by ARKEMA), "ZEFFLE" series (trade name by DAIKIN INDUSTRIES, LTD.), "Eterflon" series (trade name by Eternal Materials Co., Ltd.) and "Zendura" series (trade name by Honeywell).

The fluorine atom content in the fluorinated polymer is, in view of the adhesion of the layer to the glass plate, preferably at most 70 mass %, more preferably at most 50 mass %, particularly preferably at most 30 mass %, further preferably at most 28 mass %. Further, the fluorine atom content in the fluorinated polymer is, in view of the weather resistance of the present solar cell module, preferably at least 10 mass %, particularly preferably at least 15 mass %.

Particularly when the fluorine atom content in the fluorinated polymer is preferably from 15 to 30 mass %, particularly preferably from 15 to 28 mass %, it is considered that the present cover glass has favorable weather resistance and the layer has good adhesion to the glass plate, and in addition, such a fluorine atom content contributes to adjustment of the transmittances and the reflectances of light at the respective wavelengths of the present cover glass.

The content of the fluorinated polymer in the layer is, in view of the weather resistance of the present solar cell module, preferably from 5 to 95 mass %, particularly preferably from 10 to 90 mass %, to the total mass of the layer.

The fluorine atom content in the layer is, in view of the adhesion of the layer to the glass plate, preferably at most 65 mass %, more preferably at most 50 mass %. particularly preferably at most 40 mass %, further preferably at most 25 mass %, most preferably at most 20%. Further, the fluorine atom content in the layer is, in view of the weather resistance of the present solar cell module, preferably at least 0.1 mass %, more preferably at least 3 mass %, particularly preferably at least 5 mass %, further preferably at least 10 mass % to the total mass of the layer.

Particularly when the fluorine atom content in the layer is preferably from 0.1 to 25 mass %, particularly preferably from 5 to 20 mass %, it is considered that the present cover glass has favorable weather resistance and the layer has favorable adhesion to the glass plate and in addition, such a fluorine atom content contributes to adjustment of the transmittances and the reflectances of light at the respective wavelengths of the present cover glass.

The layer may have a crosslinked structure of the fluorinated polymer having the units F and the units (1) and a compound (hereinafter sometimes referred to as a curing agent) having in one molecule at least two groups of at least one type selected from the group consisting of an isocyanate group, a blocked isocyanate group, an epoxy group, a carbodiimide group, an oxazoline group, a β-hydroxyalkylamide group, a hydrolyzable silyl group and a silanol group. In such a case, the layer contains a cured product of the fluorinated polymer.

In a case where the layer has the above crosslinked structure, specifically, when the crosslinkable groups of the units (1) contained in the fluorinated polymer are crosslinked by the curing agent, the layer is excellent in the hardness and the durability.

Further, the present cover glass may have a crosslinked structure formed by a reaction of at least two members selected from the group consisting of the crosslinkable groups of the fluorinated polymer contained in the layer, the curing agent contained in the layer, and the glass plate (for example, reactive groups such as silanol groups present on the surface of the glass plate).

For example, in a case where a layer containing a curing agent having at least one member selected from a hydrolyzable silyl group and a silanol group is to be formed on a glass plate containing silicon oxide, e.g. the hydrolyzable silyl group (specifically a silanol group formed by hydrolysis) of the curing agent and the silanol group present on the surface of the glass plate are reacted to form a crosslinked structure. Accordingly, more excellent adhesion of the layer to the glass plate is achieved.

Further, in a case where a layer containing a fluorinated polymer having hydrolyzable silyl groups as the crosslinkable groups is formed on a glass plate containing silicon oxide, the hydrolyzable group (specifically, a silanol group formed by hydrolysis) of the fluorinated polymer and the silanol group present on the surface of the glass plate are reacted to form a crosslinked structure. Accordingly, more excellent adhesion of the layer to the glass plate, hardness of the layer and durability of the layer are achieved.

In a case where the fluorinated polymer has hydroxy groups, the curing agent is preferably a compound having at least 2 isocyanate groups or blocked isocyanate groups in one molecule.

In a case where the fluorinated polymer has carboxy groups, the curing agent is preferably a compound having at least 2 epoxy groups, carbodiimide groups, oxazoline groups or β-hydroxyalkylamide groups in one molecule.

In a case where the polymer has both hydroxy groups and carboxy groups, as the curing agent, it is preferred to use a compound having at least 2 isocyanate groups or blocked isocyanate groups in one molecule and a compound having at least 2 epoxy groups, carboxyimide groups, oxazoline groups or β-hydroxyalkylamide groups in one molecule in combination.

Further, the layer preferably contains a curing agent having at least one member selected from a hydrolyzable silyl group and a silanol group, whereby the adhesion between the layer and the glass plate in the present cover glass will more improve.

The compound having at least two isocyanate groups in one molecule is preferably a polyisocyanate monomer or a polyisocyanate derivative.

The polyisocyanate monomer is preferably an alicyclic polyisocyanate, an aliphatic polyisocyanate or an aromatic polyisocyanate. The polyisocyanate derivative is preferably a multimer or modified product (biuret, isocyanurate or adduct) of a polyisocyanate monomer.

The aliphatic polyisocyanate may, for example, be specifically an aliphatic diisocyanate such as tetramethylene diisocyanate, pentamethylene diisocyanate, hexamethylene diisocyanate, 2,2,4-trimethyl-1,6-diisocyanatohexane or lysine diisocyanate, lysine triisocyanate, 4-isocyanatomethyl-1,8-octamethylene diisocyanate or bis(2-isocyanatoethyl)2-isocyanatoglutarate.

The alicyclic polyisocyanate may, for example, be an alicyclic diisocyanate such as isophorone diisocyanate, 1,3-bis(isocyanatomethyl)-cyclohexane, 4,4'-cyclohexylmethane diisocyanate, norbornene diisocyanate or hydrogenated xylylene diisocyanate.

The aromatic polyisocyanate may, for example, be specifically an aromatic diisocyanate such as 2,4-tolylene diisocyanate, 2,6-tolylene diisocyanate, 4,4'-diphenylmethane diisocyanate, naphthalene diisocyanate or xylylene diisocyanate.

The compound having at least two blocked isocyanate groups in one molecule is preferably a compound having at least two isocyanate groups of the above polyisocyanate monomer or polyisocyanate derivate blocked by a blocking agent.

The blocking agent is a compound having active hydrogen and may, for example, be specifically an alcohol, phenol, active methylene, an amine, an imine, an acid amide, a lactam, an oxime, pyrazole, imidazole, imidazoline, pyrimidine or guanidine.

The compound having at least two epoxy groups in one molecule may, for example, be a bisphenol type epoxy compound (e.g. A type, F type or S type), a diphenyl ether type epoxy compound, a hydroquinone type epoxy compound, a naphthalene type epoxy compound, a biphenyl type epoxy compound, a fluorene type epoxy compound, a hydrogenated bisphenol A type epoxy compound, a bisphenol A-containing nuclear polyol type epoxy compound, a polypropylene glycol type epoxy compound, a glycidyl ester type epoxy compound, a glycidyl amine type epoxy compound, a glyoxal type epoxy compound, an alicyclic epoxy compound, an alicyclic multifunctional epoxy compound or a heterocyclic epoxy compound (such as triglycidyl isocyanurate).

The compound having at least two carbodiimide groups in one molecule may, for example, be an alicyclic carbodiimide, an aliphatic carbodiimide or an aromatic carbodiimide, or its multimer or modified product.

The compound having at least two oxazoline groups in one molecule may, for example, be specifically an addition-polymerizable oxazoline having a 2-oxazoline group, or a polymer of the addition-polymerizable oxazoline.

The compound having at least two β-hydroxyalkylamide groups in one molecule may, for example, be specifically N,N,N',N'-tetrakis-(2-hydroxyethyl)-adipamide (Prim id XL-552, manufactured by EMS) or N,N,N',N'-tetrakis-(2-hydroxypropyl)-adipamide (Primid QM 1260, manufactured by EMS).

The curing agent having at least one group selected from a hydrolyzable silyl group and a silanol group may be at least one member selected from a compound represented by $SiZ_aR_{4-a}$ and its partial hydrolyzed condensate. In the formula R is a $C_{1-10}$ monovalent hydrocarbon group, Z is a $C_{1-10}$ alkoxy group or a hydroxy group, and "a" is an integer of from 1 to 4.

R is a $C_{1-10}$ monovalent hydrocarbon group. The monovalent hydrocarbon group may have a substituent (for example, a fluorine atom). That is, one or more or all of the hydrogen atoms in the monovalent hydrocarbon group may be substituted by a substituent. R is preferably a methyl group, a hexyl group, a decyl group, a phenyl group, a trifluoropropyl group or the like. In a case where a plurality of R are present in one molecule, the plurality of R may be the same or different, and are preferably the same.

Z is a $C_{1-10}$ alkoxy group or a hydroxy group, preferably an alkoxy group. When Z is an alkoxy group, it is preferably a methoxy group or an ethoxy group. In a case where a plurality of Z are present in one molecule, they may be the same or different, and are preferably the same. "a" is an integer of from 1 to 4, preferably from 2 to 4.

The compound represented by $SiZ_aR_{4-a}$ may, for example, be specifically a tetrafunctional alkoxysilane (such as tetramethoxysilane, tetraethoxysilane or tetraisopropoxysilane), a trifunctional alkoxysilane (such as methyltrimethoxysilane, methyltriethoxysilane, phenyltrimethoxysilane, phenyltriethoxysilane, hexyltrimethoxysilane, hexyltriethoxysilane, decyltrimethoxysilane or trifluoropropyltrimethoxysilane) or a bifunctional alkoxysilane (such as dimethyldimethoxysilane, diphenyldimethoxysilane, dimethyldiethoxysilane or diphenyldiethoxysilane), and is preferably tetramethoxysilane, tetraethoxysilane, methyltrimethoxysilane, methyltriethoxysilane or phenyltrimethoxysilane.

The layer preferably contains at least one type of inorganic particles, whereby a high design can be imparted while the weather resistance of the layer is maintained.

The inorganic particles may, for example, be an inorganic pigment (such as a metal composite oxide pigment or an inorganic pigment other than the metal composite oxide) or a filler.

The metal composite oxide pigment may, for example, be specifically a composite oxide pigment containing at least two types of metal atoms selected from the group consisting of chromium, titanium, antimony, iron, aluminum, nickel, barium, lead, vanadium, bismuth, zinc, cobalt and manganese. The metal composite oxide pigment may, for example, be more specifically a composite oxide of chromium, titanium and antimony (orange), a composite oxide of iron, aluminum and titanium (orange), a composite oxide of nickel, titanium and antimony (yellow), a composite oxide of titanium, nickel and barium, a composite oxide of chromium and lead (yellow), a composite oxide of vanadium and bismuth (yellow), a composite oxide of nickel, cobalt, zinc and titanium (green), a composite oxide of cobalt, zinc and titanium (green), a composite oxide of zinc, nickel and titanium (brown), a composite oxide of manganese, antimony and titanium (brown), a composite oxide of aluminum and cobalt (blue), or a composite oxide of cobalt, iron and chromium (black).

The inorganic pigment other than the metal composite oxide may, for example, be specifically iron oxide (red) or lithium cobalt phosphate (purple).

The layer preferably contains, in view of the design, among the inorganic particles, at least specific inorganic particles which color the layer when used alone. Such specific inorganic particles may be a colored inorganic pigment having absorption peak in a visible region at a wavelength of from 380 to 400 nm or a white inorganic pigment having no absorption peak in a visible region, specifically, a pigment of the composition, the color of which is exemplified in the above inorganic pigment. Here, the layer being colored means that the layer having an average visible transmittance being at most 90%. Silicon oxide (for example, silica particles) as a simple substance is excluded from the specific inorganic particles since it does not color the layer when used alone. In a case where the layer contains inorganic particles, the content of the inorganic particles is preferably from 10 to 1,000 parts by mass, more preferably from 20 to 600 parts by mass per 100 parts by mass of the fluorinated polymer, whereby the transmittances and the reflectances of light at the respective wavelengths of the present cover glass are likely to be adjusted.

The layer preferably contains, as the specific inorganic particles, an inorganic pigment (hereinafter sometimes referred to as an inorganic pigment N) having a maximum near infrared reflectance in a near infrared region at a wavelength of from 780 to 1,500 nm of at least 50%, an average particle size of from 5.0 to 280.0 nm and a specific surface area of from 5.0 to 1,000 $m^2/g$. The inorganic pigment N is more preferably a colored inorganic pigment N having no absorption peak in a visible region at a wavelength of from 380 to 400 nm or a white inorganic pigment N having an absorption peak in a visible region, particularly preferably a colored inorganic pigment N.

The maximum near infrared reflectance in a near infrared region at a wavelength of from 780 to 1,500 nm of the inorganic pigment N is, in view of the near infrared transmittance of the present cover glass, at least 50%, preferably at least 60%, more preferably at least 70%, particularly preferably at least 80%. The upper limit of the maximum near infrared reflectance of the inorganic pigment N is usually 100%.

The maximum near infrared reflectance of the inorganic pigment N can be properly adjusted from the type, the composition and the crystal structure of the inorganic pigment N.

The maximum near infrared reflectance and the minimum visible reflectance of the inorganic pigment N are the maximum reflectance at a wavelength of from 780 to 1,500 nm and a minimum reflectance at a wavelength of from 400 to 780 nm respectively calculated from a diffuse reflectance spectrum obtained by measurement by diffuse reflectance method.

The average particle size of the inorganic pigment N is at least 1.0 nm, preferably at least 5.0 nm, more preferably at least 50.0 nm, particularly preferably at least 100.0 nm. The average particle size of the inorganic pigment N is at most 280.0 nm, preferably at most 200.0 nm, more preferably at most 180.0 nm, further preferably at most 160.0 nm, particularly preferably at most 140.0 nm.

When the average particle size of the inorganic pigment N is at most 280.0 nm, the present cover glass has a high near infrared transmittance, and the present solar cell module is excellent in the power generation efficiency. When the average particle size of the inorganic pigment N is at least 1.0 nm, the present solar cell module is excellent in shielding properties.

The average particle size of the inorganic pigment N is a volume-based cumulative 50% diameter (D50) obtained by measurement with respect to the inorganic pigment N subjected to ultrasonic treatment, by using a particle size distribution measuring apparatus (Nanotrac Wave II-EX150, manufactured by MicrotracBEL Corp.), and detailed measurement conditions are as disclosed in Examples.

The specific surface area of the inorganic pigment N is at least 5.0 m$^2$/g, preferably at least 10.0 m$^2$/g, more preferably at least 15.0 m$^2$/g, particularly preferably at least 40.0 m$^2$/g. The specific surface area of the inorganic pigment N is at most 1,000 m$^2$/g, preferably at most 500 m$^2$/g.

When the specific surface area of the inorganic pigment N is from 5.0 to 1,000 m$^2$/g, scattering of near infrared light by the inorganic pigment N is suitable, and the present solar cell module is excellent in the power generation efficiency.

The specific surface area of the inorganic pigment N is a value obtained by nitrogen adsorption BET method at 200° C. for 20 minutes under deaerated conditions, using a specific surface area measuring apparatus (manufactured by Mountech Co., Ltd., HM model-1208).

The particle shape of the particles constituting the inorganic pigment N is not particularly limited, and the particles may have any particle shape, for example, spherical, elliptic, needle, plate, rod, conical, columnar, cubical, cuboidal, diamond, star, scaly or irregular shape. Further, the particles constituting the inorganic pigment N may be hollow particles or may be solid particles. Further, the particles constituting the inorganic pigment N may be porous particles.

The particles constituting the inorganic pigment N are preferably spherical particles in view of dispersibility.

The inorganic pigment N is, in view of the design and the weather resistance of the present cover glass, preferably composed of e.g. a metal oxide or its hydrate, particularly preferably a metal composite oxide containing at least two types of metal elements.

The metal element may, for example, be Li, Na, Mg, K, Ca, Al, Si, Ti, V, Cr, Mn, Fe, Co, Ni, Cu, Zn, Sr, Y, Zr, Nb, Mo, Cd, In, Sn, Sb, Ba, Ta, W, Pb, Bi, La or Ce. The metal element is, in view of the near infrared reflectance of the inorganic pigment N, and the color tone of the present cover glass and the power generation efficiency, preferably Al, Fe, Co, Zn, Zr, Mn, Cr, Ce, Bi, Ni, Cu or Cd, more preferably Al, Fe, Co, Zr, Ce, Mn, Bi or Cu, further preferably Al, Fe, Co, Zn or Zr, particularly preferably Al, Fe or Co.

With a view to suppressing deterioration by the photocatalytic action, a part of or the entire metal oxide or its hydrate constituting the inorganic pigment N may further be surface-treated with the same or different type of metal oxide or its hydrate (such as silicon oxide or aluminum oxide).

The inorganic pigment N may be composed solely of the metal oxide or may contain other component. The component other than the metal oxide may, for example, be an organic compound. The inorganic pigment N, in view of the weather resistance of the present cover glass, preferably contains no other component or contains other component in a proportion of at most 50 mass % to the total mass of the inorganic pigment N.

The inorganic pigment N containing other component may be an inorganic pigment having a part of or the entire particles of the metal oxide surface-treated with e.g. an organic compound.

The colored inorganic pigment N may, for example, be specifically a Co—Ni—Ti—Zn composite oxide, a Co—Li composite oxide, a Co—Al composite oxide, a Ti—Sb—Ni composite oxide, a Co—Zn—Si composite oxide, a Co—Al—Cr composite oxide, a Co—Al—Cr—Zn composite oxide, a Co—Cr—Zn—Ti composite oxide, a Ti—Fe—Zn composite oxide, a Fe—Zn composite oxide, a Fe—Cr composite oxide, a Mn—Bi composite oxide, a Cu—Bi composite oxide, a Cu—Fe—Mn composite oxide, an iron oxide or a hydrate of an iron oxide. The colored inorganic pigment N is, in view of the dispersibility and the near infrared reflectance of the inorganic pigment N, and the shielding properties and the near infrared transmittance of the present cover glass, preferably a Co—Li composite oxide, a Co—Al composite oxide, a Co—Al—Cr composite oxide, a Fe—Cr composite oxide, a Mn—Bi composite oxide, a Cu—Bi composite oxide, a Cu—Fe—Mn composite oxide, an iron oxide or a hydrate of an iron oxide, more preferably a Co—Al composite oxide, an iron oxide or zirconium oxide, particularly preferably a Co—Al composite oxide or an iron oxide.

As the colored inorganic pigment N, commercial products may be used, such as "Daipyroxide™" series (manufactured by Dainichiseika Color & Chemicals Mfg Co., Ltd.), "Cappoxyt" series (manufactured by Cappelle), "Sicotrans" series (manufactured by BASF) and "Blue CR4" (manufactured by ASAHI KASEI KOGYO CO., LTD.).

The white inorganic pigment may, for example, be specifically titanium oxide, zirconium oxide, vanadium oxide, zinc oxide, indium oxide, tin oxide or aluminum oxide, and in view of the shielding properties of the present optical layer and the power generation efficiency of the present solar cell module, it is preferably titanium oxide, zirconium oxide or zinc oxide, particularly preferably zirconium oxide.

With a view to suppressing deterioration by photocatalytic action, a part of or the entire metal oxide constituting the white inorganic pigment N may further be surface-treated with the same or different type of metal oxide (such as silicon oxide or aluminum oxide).

In a case where the weather resistance of the present optical layer is to be more improved, for the purpose of preventing deterioration by photocatalytic action, the white inorganic pigment N preferably contains no titanium oxide or contains titanium oxide in a proportion of less than 1 mass %.

As the white inorganic pigment N, commercial products may be used, such as "TTO" series (manufactured by Ishihara Sangyo Kaisha, Ltd.), "MT" series (manufactured by TAYCA CORPORATION), "FINEX" series (manufactured by SAKAI CHEMICAL INDUSTRY CO., LTD.), XZ-F series (manufactured by SAKAI CHEMICAL INDUSTRY CO., LTD.) and "ZIRCOSTAR" series (manufactured by NIPPON SHOKUBAI CO., LTD.).

The composition of the inorganic pigment N is suitably analyzed and obtained e.g. by fluorescent X-ray analysis, ICP atomic emission spectroscopy, or atomic absorption analysis.

The inorganic pigment N has, in view of the design of the present cover glass, in the L*a*b* color space an L* value of from 5 to 100, an a* value of from −60 to 60 and a b* value of from −60 to 60.

The inorganic pigment N is preferably an inorganic pigment having the following combination of the L* value, the a* value and the b* value, more preferably an inorganic pigment having an L* value of from 15 to 80, an a* value of from 0.0 to 30 and a b* value of from −60 to 60.

An inorganic pigment having an L* value, an a* value and a b* value of from 30 to 70, from 0.0 to 30 and from −60 to −20 in this order.

An inorganic pigment having an L* value, an a* value and a b* value of from 20 to 70, from 0.0 to 40 and from −20 to 30 in this order.

An inorganic pigment having an L* value, an a* value and a b* value of from 30 to 80, from −20 to 20 and from 0 to 60 in this order.

An inorganic pigment having an L* value, an a* value and a b* value of from 80 to 100, from −10 to 10 and from −10 to 10 in this order.

An inorganic pigment having an L* value, an a* value and a b* value of from 5 to 50, from −10 to 10 and from −10 to 10 in this order.

The L* value, the a* value and the b* value of the inorganic pigment may be adjusted e.g. by the composition of the inorganic pigment N.

The L* value, the a* value and the b* value of the inorganic pigment N are values calculated from a diffuse reflectance spectrum obtained by measurement by diffuse reflectance method in accordance with JIS Z8781-4: 2013, and a detailed measurement method is as disclosed in Examples.

The density of the colored inorganic pigment N is, in view of the dispersibility of the inorganic pigment N, preferably from 2.0 to 10.0 g/cm$^3$, particularly preferably from 3.0 to 5.0 g/cm$^3$.

The density of the white inorganic pigment N is, in view of the dispersibility of the inorganic pigment N, preferably from 0.10 to 10.0 g/cm$^3$, particularly preferably from 5.0 to 7.0 g/cm$^3$.

The refractive index of the colored inorganic pigment N is, in order that the layer more selectively transmits near infrared light, preferably at most 4.00, more preferably at least 1.50 and at most 3.00, further preferably at least 1.90 and at most 2.60, particularly preferably at least 2.10 and at most 2.40.

The refractive index of the white inorganic pigment N is, in order that the layer more selectively transmits near infrared light, preferably at most 4.00, more preferably from 1.50 to 3.00, further preferably from 1.90 to 2.60, particularly preferably from 2.10 to 2.40.

The refractive index of an inorganic pigment means a refractive index of the material constituting the inorganic pigment (for example, in a case where the inorganic pigment is obtained by pulverizing the material, the material before pulverizing), and is usually a value regarding the above material disclosed in literature.

The minimum visible reflectance and the refractive index of the inorganic pigment may be properly adjusted by the composition, crystal structure, average particle size and specific surface area of the inorganic pigment.

The density of the inorganic pigment N is a value obtained by measurement by a pycnometer (ULTRAPYC 1200e manufactured by Quantachrome).

The content of the inorganic pigment N to the total mass of the layer is, in view of the design of the present cover glass, preferably at least 5 mass %, more preferably at least 10 mass %, particularly preferably at least 20 mass %. The content of the inorganic pigment N to the total mass of the layer is, in view of the near infrared transmittance of the present cover glass, preferably at most 80 mass %, more preferably at most 60 mass %, particularly preferably at most 50 mass %.

The proportion of the inorganic pigment N to the total mass of the inorganic particles contained in the layer is, in view of the design and the power generation efficiency, preferably at least 80 mass %, particularly preferably at least 90 mass %.

The layer may contain two or more types of inorganic pigment N. In a case where the colored inorganic pigment and the white inorganic pigment N are used in combination, the proportion of the white inorganic pigment N to the total amount of such inorganic pigments N is preferably from 5 to 200 mass %, more preferably from 20 to 150 mass %, particularly preferably from 20 to 40 mass %. When the layer contains the colored inorganic pigment N in a larger amount than the white inorganic pigment N, the shielding properties of the present optical layer and the design of the present solar cell module will be well balanced.

Particularly, the white inorganic pigment N is also a light scattering inorganic pigment having a minimum visible reflectance in a visible region at a wavelength of from 400 to 780 nm of at least 40%. Accordingly, by mixing the colored inorganic pigment N and the white inorganic pigment N, the present solar cell module is more excellent in shielding properties.

The white inorganic pigment N has, in order that the layer more selectively scatters visible light, a minimum visible reflectance in a visible region at a wavelength of from 400 to 780 nm of at least 40%, preferably at least 80%, more preferably at least 90%, particularly preferably at least 95%. The upper limit of the minimum visible reflectance is usually 100%.

The inorganic pigment N, which has a maximum near infrared reflectance at a wavelength of from 780 to 1,500 nm of at least 50%, an average particle size of from 5.0 to 280.0 nm and a specific surface area of from 5.0 to 1,000 m$^2$/g, hardly scatters near infrared light in sunlight, and is likely to be suitably dispersed in the fluorinated polymer. Accordingly, by using as the inorganic pigment N the colored inorganic pigment N having sufficient absorption in a visible region, the design can be improved. Accordingly, in a case where the present cover glass has a layer containing the inorganic pigment N, the present cover glass is considered to have high shielding properties and be excellent in the weather resistance and further be particularly excellent in the design and the power generation efficiency when applied to a solar cell module.

The specific inorganic particles other than the inorganic pigment N may be light scattering particles not corresponding to the inorganic pigment N. Such light scattering particles are preferably a flaky inorganic pigment (pearl pigment) having a structural color.

The pearl pigment is a pigment comprising flaky particles (for example, particles having a maximum size of from 2 to 100 μm and a thickness of from 0.01 to 10 μm) the surface of which is coated with a metal or its oxide. The flaky particles may be composed of mica, sericite, talc, kaolin, smectite clay mineral, mica, sericite, plate-like titanium dioxide, plate-like silica, plate-like aluminum oxide, boron nitride, barium sulfate, plate-like titania/silica composite oxide, glass or the like. The metal or its oxide coating the surface of the flaky particles may be the metal or its oxide mentioned for the above inorganic particles. The pearl pigment is preferably flaky particles comprising mica, glass, aluminum oxide or the like, the surface of which is covered with titanium dioxide, iron oxide, silver or the like.

In a case where the layer contains the pearl pigment as the light scattering particles, it can achieve a brighter and more glittering color tone, and the present solar cell module is more excellent in the design.

The pearl pigment may, for example, be METASHINE titania coated series (manufactured by Nippon Sheet Glass Co., Ltd.) or TWINCLEPEARL silver type (manufactured by NIHON KOKEN KOGYO CO., LTD.).

The layer may contain, as the inorganic particles, other than the above specific inorganic particles, particles M having a volume-based cumulative 50% diameter of from 2 to 2,000 µm.

The refractive index of the material constituting the particles M is preferably at least 1.20, more preferably at least 1.30, further preferably at least 1.35. The refractive index of the material constituting the particles M is preferably at most 1.70, more preferably at most 1.60, particularly preferably at most 1.55.

When the refractive index of the particles M is within the above range, a difference in the refractive index with the fluorinated polymer having units based on a fluoroolefin tends to be small, and light is likely to be transmitted.

The particles M may, for example, be glass beads, silica sand, sea sand or silica particles.

The layer may contain a non-fluororesin. The non-fluororesin may, for example, be specifically an alkyd resin, an aminoalkyd resin, a polyester resin, an epoxy resin, an urethane resin, an epoxy polyester resin, a vinyl acetate resin, an acrylic resin, a vinyl chloride resin, a phenol resin, a modified polyester resin, an acrylic silicone resin or a silicone resin. Among such specific examples, in a case where the non-fluororesin is a curable resin, the non-fluororesin contained in the layer is usually a cured resin.

The layer may contain, within a range not to impair the effects of the present invention, as the case requires, a component other than the above (hereinafter sometimes referred to as "component X"). The component X may, for example, be a curing catalyst, an organic filler, an organic pigment, copper phthalocyanine (blue, green), perylene (red), an organic photostabilizer, an organic ultraviolet absorber, an inorganic ultraviolet absorber, a delustering agent, a leveling agent, a surface modifier, a degassing agent, a filler, a thermal stabilizer, a thickener, a dispersing agent, a surfactant, an anti-static agent, an anti-corrosive agent, a silane coupling agent, a stain-proofing agent or a low contamination treatment agent.

However, among the components X, a component which changes at the time of forming a layer itself is usually a component which is not contained in the layer. For example, the curing agent itself is a component which is not present in the layer, and further, among the components X, e.g. the silane coupling agent itself is not present in the layer, in many cases. A component which disappears at the time of forming the layer, for example, a solvent in the case of a coating material containing the solvent as described hereinafter, is not a component X.

The layer may contain, as the component X, particularly an organic filler, with a view to imparting a design by surface irregularities to the present cover glass. The organic filler is particles having a volume-based cumulative 50% diameter of at least 2 µm and at most 2,000 µm.

The refractive index and its preferred range of the material constituting the organic filler are the same as those of the particles M.

The organic filler may, for example, be resin beads.

In this specification, the particles M and the organic filler may sometimes be generally referred to as a "filler". The layer may contain, as the filler, both the particles M and the organic filler.

The layer may contain an organic pigment as the component X. Preferred physical properties (average particle size, specific surface area, maximum infrared reflectance, shape, density, L* value, a* value and b* value) and their preferred ranges of the organic pigment are the same as those of the inorganic pigment N.

The L* value, the a* value and the b* value of the layer are values calculated from a reflectance spectrum obtained by measurement of reflected light at a wavelength of from 200 to 1,500 nm at 5 nm intervals by using a spectrophotometer such that the layer is installed so that light enters from the normal direction of the surface of the layer, in accordance with JIS X8781-4: 2013.

The organic pigment may, for example, be carbon black (black).

In this specification, the inorganic pigment N and the organic pigment may sometimes be generally referred to as a "pigment". The layer may contain, as the pigment, both the inorganic pigment N and the organic pigment. However, in a case where the weather resistance of the present cover glass is to be further improved, the layer preferably contains no organic pigment or contains the organic pigment in a proportion of less than 1 mass %.

The average layer thickness is, with a view to suitably controlling the transmittances and the reflectances at the respective wavelengths, preferably from 1 to 3,000 µm, particularly preferably from 5 to 2,000 µm.

When the average layer thickness is within the above range and the average glass plate thickness is from 1 to 30 mm, the transmittances and the reflectances at the respective wavelengths can be more suitably controlled.

The average layer thickness is an arithmetic mean of layer thicknesses measured by using an eddy-current instrument for measuring thickness.

A method for producing the layer may, for example, be specifically a method of applying a liquid composition containing a fluorinated polymer (a coating material containing a liquid medium such as water or an organic solvent) to a glass plate, followed by drying to form the layer. In the case of a coating material containing no liquid medium, such as a powder coating material, drying to remove the liquid medium is not necessary.

The coating method may, for example, be specifically a method employing spraying, an applicator, a die coater, a bar coater, a roll coater, a comma coater, a roller brush, a brush or a spatula.

After the coating material containing a fluorinated polymer is applied, the coating material may be dried by heating so as to remove the solvent in the coating material. Further, in a case of a coating material containing a reactive component such as the above-described curing agent, usually, the coating layer formed from the coating material is heated to make reactive components be reacted to form a layer.

Otherwise, a layer may be preliminarily formed, which is laminated on a glass plate.

The layer is preferably formed by using a coating material containing a fluorinated polymer. The coating material is preferably a liquid coating material.

In a case where the present solar cell module is to be produced, it is preferred that the coating material is applied to a glass plate to form a layer, and the obtained cover glass is contact-bonded to the after-described encapsulant material. Accordingly, the layer in the cover glass is preferably a layer formed by applying the coating material, also in that the layer will not protrude at the edges at the time of contact-bonding to the encapsulant material, as compared with a case where the layer is in a film-form.

The coating material may contain, in addition to the fluorinated polymer, inorganic particles, a non-fluororesin, the component X, etc., which the above-described layer may contain. The inorganic particles, the non-fluororesin and the component X are the same as described above, and their detailed description is omitted. In a case where the coating material is a liquid coating material, it further contains a liquid medium such as water or an organic solvent.

The solid content concentration of the coating material is preferably adjusted by the liquid medium to preferably from 10 to 90 mass %, more preferably from 40 to 70 mass % to the total mass of the coating material.

In a case where the fluorinated polymer in the coating material is a fluorinated polymer having carboxy groups, the acid value of the fluorinated polymer in the coating material is, in view of the strength of the layer, preferably from 1 to 200 mgKOH/g, more preferably from 1 to 150 mgKOH/g, further preferably from 3 to 100 mgKOH/g, particularly preferably from 5 to 50 mgKOH/g.

In a case where the fluorinated polymer in the coating layer is a fluorinated polymer having hydroxy groups, the hydroxy value of the fluorinated polymer in the coating material is, in view of the strength of the layer, preferably from 1 to 200 mgKOH/g, more preferably from 1 to 150 mgKOH/g, further preferably from 3 to 100 mgKOH/g, particularly preferably from 10 to 60 mgKOH/g.

The fluorinated polymer in the coating material may have only one of the acid value and the hydroxy value, or may have both.

The content of the fluorinated polymer in the coating material is, in view of the weather resistance of the present solar cell module, preferably from 5 to 90 mass %, particularly preferably from 10 to 80 mass %, to the total mass of the solid content contained in the coating material.

The content of the fluorinated polymer in the solid content of the coating material is preferably 10 to 90 mass %, particularly preferably from 40 to 70 mass % to the total mass of the solid content of the coating material.

The other description relating to the fluorinated polymer in the coating material is the same as the above-described fluorinated polymer and is omitted.

The coating material may contain a curing agent which forms a crosslinked structure in the layer.

In a case where the fluorinated polymer in the coating material has crosslinkable groups, the layer can be cured by reacting the functional groups of the fluorinated polymer in the coating material and the curing agent to crosslink the fluorinated polymer. In such a case, a layer having a crosslinked structure of the fluorinated polymer and the curing agent is formed.

Further, in a case where the curing agent in the coating material contains at least one member selected from a hydrolyzable silyl group and a silanol group, the curing agent, and the glass plate containing silicon oxide, and as the case requires, the fluorinated polymer, are reacted to form a layer having a crosslinked structure of the curing agent and the glass plate and as the case requires, the fluorinated polymer.

In a case where the coating material contains the curing agent, the content of the curing agent is preferably from 5 to 200 parts by mass, particularly preferably from 10 to 150 parts by mass per 100 parts by mass of the fluorinated polymer in the coating material.

The coating material may contain a dispersing agent as the component X. Particularly in a case where the coating material contains the inorganic pigment N as the inorganic particles, it preferably contains a dispersing agent. When the coating material contains a dispersing agent, the pigment hardly aggregate, and expected optical properties are likely to be obtained.

The dispersing agent may, for example, be a fatty amide, an ester salt of an acid polyamide, an acrylic resin, an oxidized polyolefin or a polymer compatible with the inorganic pigment. As the dispersing agent, commercial products may be used, such as "DISPARLON" series (trade name by Kusumoto Chemicals, Ltd.) and "DISPERBYK" series (trade name by BYK Japan K.K.).

The coating material preferably contains a liquid medium. The liquid medium may be water or an organic solvent, and is preferably an organic solvent. In a case where the coating material contains an organic solvent, the coating material is preferably a solvent-based coating material containing the fluorinated polymer and an organic solvent and having the fluorinated polymer dissolved in the organic solvent. In such a case, adhesion between the glass plate and the layer or between a primary layer applied on the glass plate and the layer is likely to improve.

The organic solvent may, for example, be a petroleum-based mixed solvent (toluene, xylene, SOLVESSO 100 manufactured by Exxon Mobil Corporation, SOLVESSO 150 manufactured by Exxon Mobil Corporation, etc.), an aromatic hydrocarbon solvent (such as mineral spirit), an ester solvent (such as ethyl acetate or butyl acetate), a ketone solvent (methyl ethyl ketone, methyl isobutyl ketone or cyclohexanone) or an alcohol solvent (such as ethanol, tert-butyl alcohol or isopropyl alcohol). The organic solvent may be used in combination of two or more.

The average visible reflectance of the present cover glass is from 10 to 100%. The average visible reflectance of the present cover glass is preferably at least 12%, more preferably at least 15%, particularly preferably at least 20%. The average visible reflectance is at most 100%. When the average visible reflectance is within the above range, the design of the solar cell module of the present invention is excellent.

In the visible region at a wavelength of from 380 to 780 nm, among reflectances at the respective wavelengths at 5 nm intervals, the maximum reflectance of the present cover glass (hereinafter sometimes referred to as the maximum visible reflectance) is preferably at least 20%, more preferably at least 25%, further preferably at least 30%, particularly preferably at least 40%. The maximum visible reflectance is at most 100%. When the maximum visible reflectance is within the above range, the color tone of the present cover glass will be brighter, and the solar cell module of the present invention is more excellent in the design.

The method for measuring the reflectance is as described above, and detailed measurement conditions are as described in the after-described Examples.

The average near infrared transmittance of the present cover glass is at least 20%, preferably at least 30%, more preferably at least 40%, particularly preferably at least 50%. The average near infrared transmittance is at most 100%. When the average near infrared transmittance is at least 20%, the solar cell module of the present invention is excellent in the power generation efficiency.

The average visible transmittance of the present cover glass is, in view of the design of the present solar cell module, preferably less than 80%, more preferably less than 70%, particularly preferably at most 65%, further preferably at most 60%, most preferably at most 50%. The average visible transmittance is at least 0%. When the average visible transmittance is less than 80%, preferably less than 70%, solar cells are hardly visually recognized from a light-receiving surface side of the solar cell module, and the solar cell module of the present invention is excellent in the design.

In a visible region at a wavelength of from 380 to 780 nm, among transmittances at the respective wavelengths at 5 nm intervals, the maximum transmittance of the present cover glass (hereinafter sometimes referred to as the maximum visible transmittance) is preferably less than 70%, more preferably at most 65%, further preferably at most 60%, particularly preferably at most 50%. The maximum visible transmittance is at least 0%. When the maximum visible transmittance is less than 70%, solar cells are hardly visually recognized from a light-receiving surface side of the solar cell module, and the solar cell module of the present invention is more excellent in the design.

The method for measuring the transmittance is as described above, and detailed measurement conditions are as described in the after-described Examples.

FIG. 1 illustrates an embodiment in which a layer 214 is directly present on one surface of a glass plate 114, as the present cover glass, however, layers may be present on both surfaces of the glass plate, or an optional layer (such as an adhesive layer) may be disposed between the glass plate and the layer. The layer being formed from the above-described coating material is advantageous in that no adhesive layer is necessary.

Figure 2:
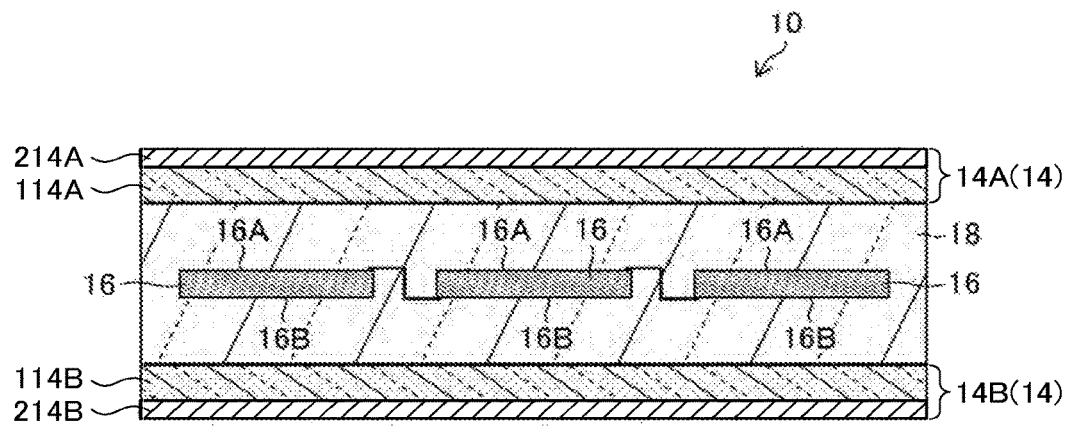
FIG. 2 is a cross-sectional view schematically illustrating an example of a solar cell module comprising a cover glass of the present invention.

FIG. 2 is cross-sectional view illustrating a solar cell module 10.

As shown in FIG. 2, a solar cell module 10 comprises a first cover glass 14A, a plurality of solar cells 16, a second cover glass 14B, and an encapsulant material 18. In the following description, the first cover glass 14A and the second cover glass 14B may sometimes be generally referred to as a cover glass 14.

In the solar cell module 10, each of the plurality of solar cells 16 is encapsulated in the encapsulant material 18. The solar cells 16 are usually connected in series or in parallel.

Each solar cell 16 has a first light-receiving surface 16A and a second light-receiving surface 16B facing the first light-receiving surface 16A. The solar cell 16 has a function to convert light energy received by the first light-receiving surface 16A and the second light-receiving surface 16B to electric energy.

FIG. 2 illustrates an embodiment in which the cover glass is laminated on both surfaces of the solar cells 16, however, the present solar cell module may have an embodiment in which the present cover glass is laminated on one light-receiving surface side of the solar cells, and a glass plate, a resin film or the like is laminated on the other surface side of the solar cells. Particularly in a case where the solar cell module is installed on a wall surface or windows of a building, in order to secure the strength, it is preferred that the present cover glass is laminated on one light-receiving surface side of the solar cells, and the present cover glass or a glass plate is laminated on the other surface side of the solar cells.

Further, the present solar cell module may have an optional layer (such as an adhesive layer) between the cover glass and the encapsulant material within a range not to impair the effects of the present invention.

The cover glass 14 is used as a cover glass for a solar cell module, to protect the solar cells 16 and to impart a design to the solar cell module 10.

The first cover glass 14A is bonded on one surface of the encapsulant material 18 on the first light-receiving surface 16A side of the solar cells 16. Further, the second cover glass 14B is bonded to the other surface (the side opposite from the surface to which the first cover glass 14A is bonded) of the encapsulant material 18 on the second light-receiving surface 16B side of the solar cells 16.

The first cover glass 14A comprises a glass plate 114A and a layer 214A containing a fluorinated polymer having units based on a fluoroolefin, on the glass plate 114A.

In the first cover glass 14A in FIG. 2, the glass plate 114A is laminated on the light-receiving surface 16A side from the layer 214A, however, the layer 214A may be present on the light-receiving surface 16A side from the glass plate 114A. In such a case, the glass plate is disposed as an outermost layer, such being preferred in that a design can be imparted to the present solar cell module while the outer appearance of the glass plate is made good use of.

The second cover glass 14B comprises a glass plate 114B and a layer 214B containing a fluorinated polymer having units based on a fluoroolefin, on the glass plate 114B. The glass plate 114B and the layer 214B are respectively the same as the glass plate 114A and the layer 214A, and their description is omitted.

The solar cells in the present invention are preferably made of a material having spectral sensitivity in a near infrared region. Specifically, they may be silicon-based solar cells composed of monocrystalline silicon, polycrystalline silicon or the like, or compound-based solar cells composed of e.g. GaAs, CIS, CIGS, CdTe, InP, $Zn_3P_2$ or $Cu_2S$. The solar cells are particularly preferably SIS solar cells or CIGS solar cells, which require no wiring and thereby achieves more excellent design of the present solar cell module and can be suitably used as an outer wall material, and which are more excellent in the power generation in the near infrared region. Further, in a case where the solar cells have wiring, in view of the design, the wiring is preferably black or coated in black.

Figure 3:
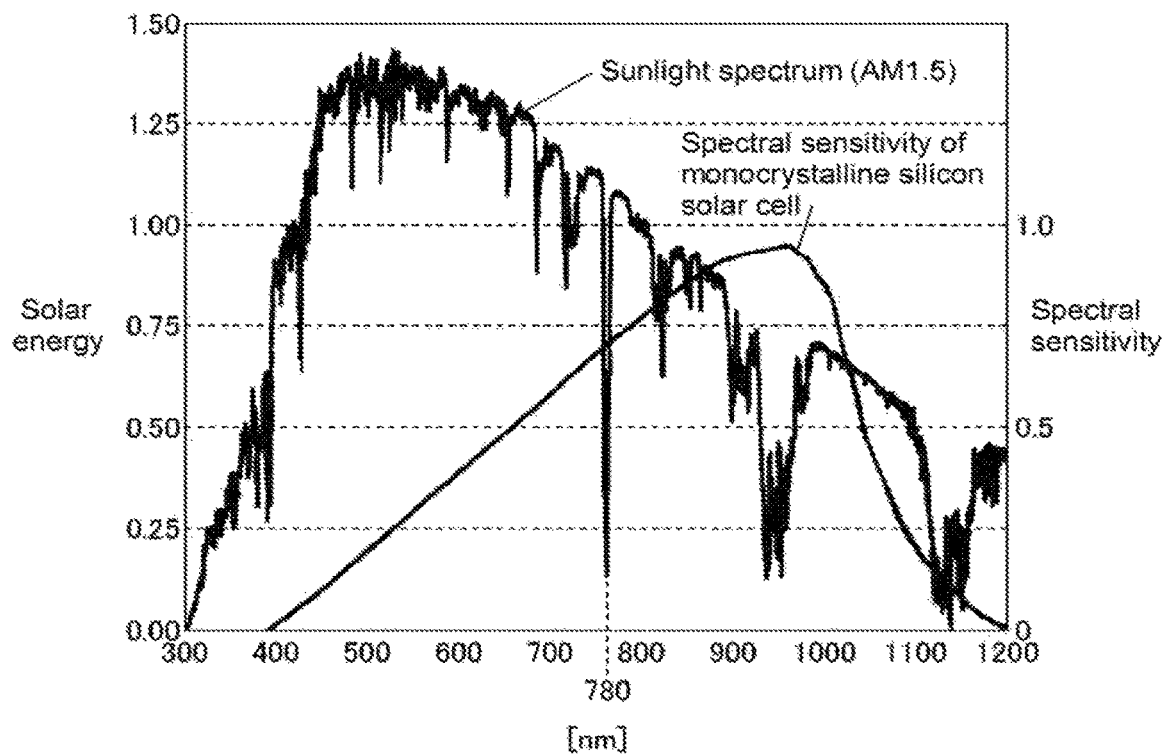
FIG. 3 is a graph illustrating a sunlight spectrum on the ground and a spectral sensitivity curve of a monocrystalline silicon solar cell.

FIG. 3 is a graph illustrating a sunlight spectrum (solar energy) on the ground and a spectral sensitivity curve of a monocrystalline silicon solar cell.

As shown in FIG. 3, the monocrystalline silicon-based solar cell has high spectral sensitivity also in a long wavelength range at a wavelength of higher than 780 nm. That is, it means that a solar cell module has both the design and the power generation efficiency by using, as the cover glass, the present cover glass showing a high transmittance in a long wavelength region while having a low visible transmittance and high design.

The encapsulant material in the present invention is preferably transparent. When the encapsulant material is transparent, for example in the case of FIG. 2, light which passed through the first cover glass 14A or the second cover glass 14B is likely to arrive at the first light-receiving surface 16A or the second light receiving surface 16B of the solar cells 16. Particularly since the present cover glass suitably controls the transmittances and the reflectances at the respective wavelengths, when the encapsulant material is transparent, more excellent effects by the present cover glass will be obtained.

The material constituting the encapsulant material may, for example, be specifically an ethylene/vinyl acetate copolymer, an olefin resin, a polyvinyl butyral resin, an ionomer resin or a silicone resin. The encapsulant material typically preferably contains no inorganic pigment or the like in the present invention or if contains, in a proportion of less than 1 mass %, since it is required to have adhesion to the solar cells and a protective effect.

Figure 4:
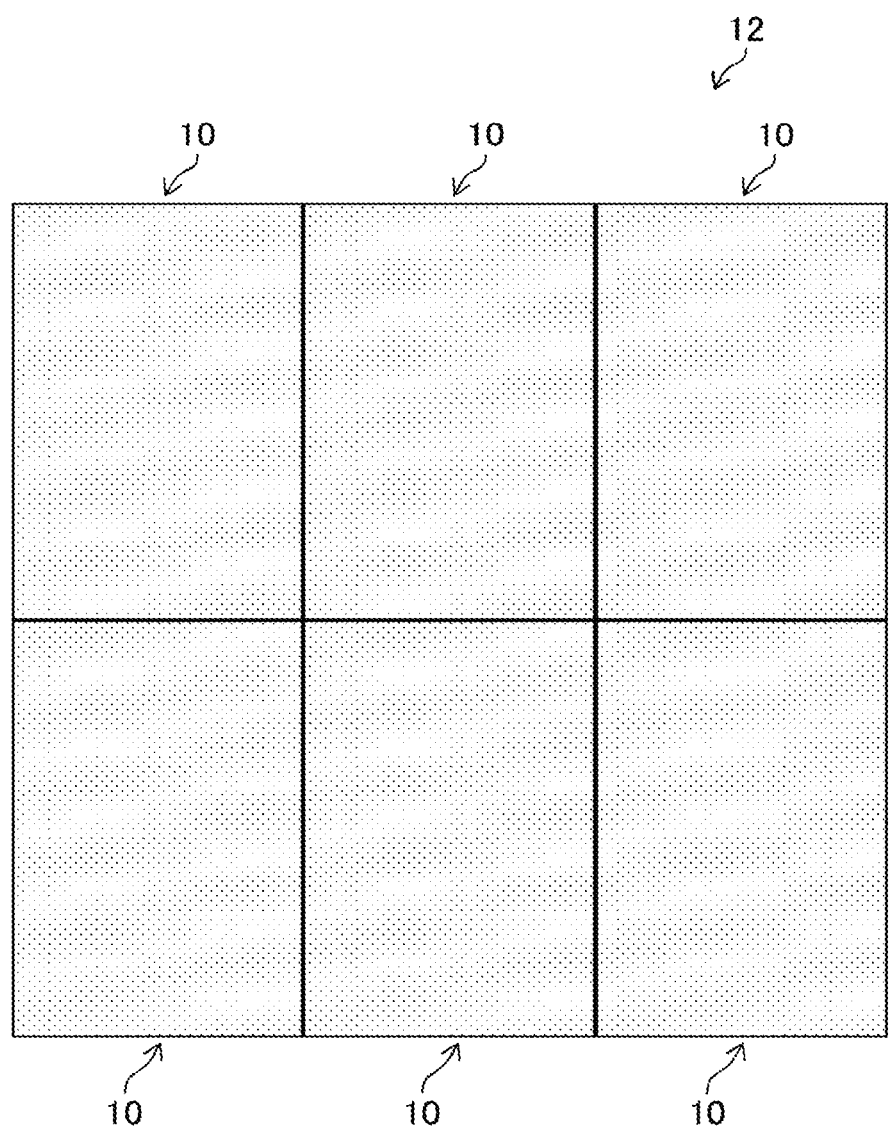
FIG. 4 is a plan view schematically illustrating an example of a solar cell array constituted by solar cell modules of the present invention.

FIG. 4 is a plan view schematically illustrating an example of a solar cell array constituted by the present solar cell modules.

As shown in FIG. 4, a solar cell array 12 is constituted by a plurality of rectangular solar cell modules 10 aligned in a plane and connected in series or in parallel.

The installation site of the solar cell array of the present invention may, for example, be specifically the rooftop, the roof or the outer wall (for example, a wall surface or a window) of a building.

The present solar cell module, which is excellent in the design as described above, is preferably used for an outer wall material of a building (for example, a wall surface or a window of a building).

The outer wall material for building of the present invention comprises the present solar cell module described above. Accordingly, the outer wall material for building of the present invention is excellent in the weather resistance, the design and the power generation efficiency. The outer wall material for building may, for example, be specifically a curtain wall, a wall material or a window.

EXAMPLES

Now, the present invention will be described in further detail with reference to Examples. However, it should be understood that the present invention is by no means restricted to specific Examples. Ex. 1 to 5, 10, 11 and 13 to 17 are Examples of the present invention, and Ex. 6 to 9 and 12 are Comparative Examples.

<Polymer Solution Used>

Polymer (1) solution: a xylene solution of a chlorotrifluoroethylene/vinyl ether copolymer ("LF-200" manufactured by AGC Inc., prepared to have a polymer concentration of 60 mass %, fluorine atom content: 27 mass %, hydroxy value: 52 mgKOH/g) Polymer (2) solution: a N-methyl-2-pyrolidone solution of a vinylidene fluoride homopolymer (prepared to have a polymer concentration of 60 mass %, fluorine atom content: 59 mass %, hydroxy value: 0 mgKOH/g)

Polymer (3) solution: a butyl acetate solution of a tetrafluoroethylene/vinyl ester/allyl ether copolymer (prepared to have a polymer concentration of 60 mass %, fluorine atom content: 18 mass %, hydroxy value: 35 mgKOH/g)

Polymer (4) solution: a butyl acetate solution of an acrylate polymer (prepared to have a polymer concentration of 60 mass %, fluorine atom content: 0 mass %, hydroxy value: 47 mgKOH/g)

Ex. 1

<Preparation of Coating Material>

16.7 g of the polymer (1) solution, 43.2 g of xylene and 40 g of lithium cobalt phosphate (manufactured by Tokan Material Technology Co., Ltd.) were added, and further 100 g of glass beads having a diameter of 1 mm were added, followed by stirring by a rocking mill (Seiwa Giken, RM-05S) for 2 hours. After stirring, the glass beads were removed by filtration, and 38.2 g of the obtained solution, 52.1 g of the polymer (1) solution, 7.2 g of xylene, 2.4 g of a xylene solution of dibutyltin dilaurate (10,000-fold diluted) and 6.4 g of Coronate HX (manufactured by TOSOH CORPORATION, curing agent: HDI isocyanurate type polyisocyanurate, solid content: 100 mass %, standard type) were mixed to obtain a coating material.

<Preparation of Cover Glass>

The coating material was applied to a soda lime silicate glass plate ($Fe_2O_3$ content: 0.1 mass %) having an average plate thickness of 2.8 mm by an applicator, and dried and cured in a thermostatic chamber at 25° C. for one week to obtain a cover glass comprising the glass plate and a layer (average layer thickness: 50 μm) on the glass plate.

Ex. 2 to 3, 6 to 9 and 14

A cover glass was obtained in the same manner as in Ex. 1 except that the type of the pigment was changed as identified in Table 1 (Ex. 2 to 3 and 6 to 8: product manufactured by Tokan Material Technology Co., Ltd., Ex. 9: product manufactured by AGC Si-Tech Co., Ltd., Ex. 14: product manufactured by ASAHI KASEI KOGYO CO., LTD.).

Ex. 4 to 5

A cover glass was obtained in the same manner as in Ex. 1 except that the type of the pigment was changed as identified in Table 1 (Ex. 4 to 5: manufactured by Tokan Material Technology Co., Ltd.) and that the amount of application of the coating material was adjusted so that the average layer thickness of the layer on the glass plate would be 10 μm.

Ex. 10 to 12

A cover glass was obtained in the same manner as in Ex. 2 except that the type of the polymer solution was changed as identified in Table 2 and that the amount of addition of the curing agent used to prepare the coating material was changed. The amounts of addition of the curing agent used to prepare the coating material using the polymer 2 solution, the polymer 3 solution and the polymer 4 solution were respectively 0 g, 4.3 g and 5.8 g.

Ex. 13

A cover glass was obtained in the same manner as in Ex. 2 except that a soda lime silicate glass plate having an average plate thickness of 2.8 mm having a $Fe_2O_3$ content as identified in Table 3 ($Fe_2O_3$ content: 0.3 mass %) was used.

Ex. 15

A cover glass was obtained in the same manner as in Ex. 2 except that in Ex. 14, as the pigment, 31 g of cobalt aluminum oxide and 9 g of zirconium oxide were used.

The fluorine atom contents in the layers obtained from the coating materials in Ex. 1 to 9 and 13 to 15, Ex. 10, Ex. 11 and Ex. 12 were respectively 15 mass %, 39 mass %, 10 mass % and 0 mass %.

[Evaluation Method]

<Inorganic Particles>

(Average Particle Size of Inorganic Pigment N)

A sample to be measured was poured into distilled water in a concentration of 0.1 mass %, and a dispersing agent (Poiz 532A, manufactured by Kao Corporation) was added in an amount of 1 mass % to the solid content to obtain a slurry. The obtained slurry was subjected to ultrasonic treatment by a table ultrasonic cleaning machine (1510 J-MT, manufactured by Branson Ultrasonics, Emerson Japan Ltd.) for 6 hours, and 10 minutes, 30 minutes and then every 30 minutes after initiation of the ultrasonic treatment, the volume-based cumulative 50% diameter (D50) was measured by a particle size distribution measuring apparatus (Nanotrac Wave II-EX150, manufactured by MicrotracBEL Corp.). Among the cumulative 50% diameters (D50) at 13 points, the smallest value was taken as the average particle size.

(L* Value, a* Value and b* Value)

The L* value, the a* value and the b* value of the inorganic particles are calculated from a diffuse reflectance spectrum obtained by measurement by diffuse reflectance method in accordance with JIS Z8781-4: 2013.

The diffuse reflectance spectrum was obtained by measuring the diffuse reflected light at 5 nm intervals within a wavelength range of from 200 to 1,500 nm, by holding the inorganic particles in a glass holder having a depth of 0.5 mm and covering the sample with a quartz cover by using a spectrophotometer (U-4100, manufactured by Hitachi High-Technologies Corporation), by diffuse reflectance method. As a reference, barium sulfate (reagent, manufactured by KANTO CHEMICAL CO, INC.) was used.

(Maximum Near Infrared Transmittance and Minimum Visible Reflectance)

As the maximum near infrared transmittance and the minimum visible reflectance of the inorganic particles, the maximum reflectance at a wavelength of from 780 to 1,500 nm and the minimum reflectance at a wavelength of from 400 to 780 nm were calculated from the above diffuse reflectance spectrum.

<Layer>

(Average Visible Transmittance, Maximum Visible Transmittance and Average Near Infrared Transmittance)

The total reflectance of the cover glass was measured at 5 nm intervals within a wavelength range of from 380 to 1,500 nm at a scanning rate of 1,200 nm/min by using a spectrophotometer (manufactured by Hitachi High-Technologies Corporation, trade name: U-4100).

The cover glass was placed so as to be in contact with a light-receiving part of an integrating sphere, and set so that light entered from the coated surface (that is, the surface of the layer).

The light source switching was automatic, the switching wavelength was 340.0 nm, the slit was fixed at 8 nm, and the sampling interval was 5 nm.

Further, there was no detector switching correction, the detector switching wavelength was 850.0 nm, the scanning speed was 750 nm/min, the slit was automatically controlled, the Pbs sensitivity was 2, and the light control mode was fixed.

The average visible transmittance was obtained as the arithmetic mean of transmittances at 5 nm intervals in a visible region at a wavelength of from 380 to 780 nm in the total transmittance obtained by the above measurement.

The average near infrared transmittance was obtained as the arithmetic mean of transmittances at 5 nm intervals in a near infrared region at a wavelength of from 780 to 1,500 nm in the total transmittance obtained by the above measurement.

The maximum visible transmittance is the maximum value of transmittances in a visible region at a wavelength of from 380 to 780 nm among the transmittances at 5 nm intervals obtained by the above measurement.

(Average Visible Reflectance and Maximum Visible Reflectance)

The total reflectance of the cover glass was measured at 5 nm intervals within a wavelength range of from 380 to 1,500 nm at a scanning rate of 1,200 nm/min by using a spectrophotometer (manufactured by Hitachi High-Technologies Corporation, trade name: U-4100).

The cover glass was placed so as to be in contact with a light-receiving part of an integrating sphere, and set so that light entered from the coated surface (that is, the surface of the layer).

The light source switching was automatic, the switching wavelength was 340.0 nm, the slit was fixed at 8 nm, and the sampling interval was 5 nm.

Further, there was no detector switching correction, the detector switching wavelength was 850.0 nm, the scanning speed was 750 nm/min, the slit was automatically controlled, the Pbs sensitivity was 2, and the light control mode was fixed.

The average visible reflectance was obtained as the arithmetic mean of reflectances at 5 nm intervals in a visible region at a wavelength of from 380 to 780 nm in the total reflectance obtained by the above measurement.

The maximum visible reflectance is the maximum value of reflectances in a visible region at a wavelength of from 380 to 780 nm among the reflectances at 5 nm intervals obtained by the above measurement.

(Power Generation Efficiency)

Taking the power generation contribution degrees of the visible light (380 to 780 nm) and the near infrared light (780 to 1,500 nm) of the monocrystalline silicon cell being 30% and 70%, respectively, the average visible transmittance and the average near infrared transmittance were multiplied and added, to calculated the power generation efficiency of the monocrystalline silicon cell using as the cover glass an uncoated soda lime silicate glass plate ($Fe_2O_3$ content: 0.1 mass %) having an average plate thickness of 2.8 mm.

(Rear Side Recognizability)

The obtained cover glass was placed on white paper on which characters in a 2 mm font was printed, so that the coated surface faced upward, and the rear side recognizability was visually evaluated. If the rear side recognizability is rated as C, the design of the present invention is not satisfied.

<Evaluation Standards>

A: Presence of characters are not visually recognized at all.

B: Presence of characters can be visually recognized, but the characters cannot be read.

C: Presence of characters can be visually recognized, and the characters can be read.

(Weather Resistance of Cover Glass)

An accelerated weathering test was conducted using Accelerated Weather Tester (manufactured by Q-PANEL LAB PRODUCTS, model QUV/SE). The average visible transmittance and the average near infrared transmittance of the cover glass immediately before the test, and the average visible transmittance and the average near infrared transmittance of the cover glass 2,000 hours after initiation of the test, were measured by a spectrophotometer, and the power generation efficiency was calculated in accordance with the above description.

The proportion of the power generation efficiency value 2,000 hours after initiation of the test based on the power generation efficiency value immediately before the test being 100% was calculated as the power generation efficiency retention (unit: %), and the weather resistance was evaluated based on the following standards.

<Evaluation Standards>

A: The power generation efficiency retention being at least 95%.

B: The power generation efficiency retention being at least 80% and less than 95%.

C: The power generation efficiency retention being at least 70% and less than 80%.

D: The power generation efficiency retention being less than 70%, or peeling of the layer from the cover glass observed.

The obtained results are shown in Tables 1 to 3. With respect to the cover glass in each of Ex. 1 to 9, the color of the layer visually confirmed, and the average layer thickness of the layer formed on the glass plate, are shown in Table 1.

TABLE 1

| | Inorganic particles | Polymer | Color of layer | Average layer thickness μm | Transmittance Average near infrared % | Average visible % | Maximum visible % | Reflectance Average visible % | Maximum visible % | Power generation efficiency % | Rear side recogniz-ablity | Weather resis-tance of cover glass |
|---|---|---|---|---|---|---|---|---|---|---|---|---|
| Ex. 1 | Lithium cobalt phosphate | (1) | Purple | 50 | 60.4 | 48.8 | 60 | 15.7 | 26.3 | 57 | B | A |
| Ex. 2 | Cobalt aluminum oxide | (1) | Blue | 50 | 38.8 | 19.3 | 50 | 22.4 | 37.5 | 33 | A | A |
| Ex. 3 | Nickel titanium antimony oxide | (1) | Yellow | 50 | 22.0 | 14.7 | 23 | 58.3 | 78.4 | 20 | A | A |
| Ex. 4 | Nickel titanium antimony oxide | (1) | Yellow | 10 | 51.6 | 47.9 | 54 | 22.0 | 26.7 | 50 | B | A |
| Ex. 5 | Chromium titanium antimony oxide | (1) | Brown | 10 | 41.9 | 27.8 | 39 | 20.7 | 29.2 | 38 | B | A |
| Ex. 6 | Chromium titanium antimony oxide | (1) | Brown | 50 | 13.0 | 1.7 | 6 | 44.6 | 85.6 | 10 | A | A |
| Ex. 7 | Zinc nickel titanium oxide | (1) | Green | 50 | 12.5 | 1.1 | 11 | 15.8 | 50.4 | 9 | A | A |
| Ex. 8 | Cobalt iron chromium oxide | (1) | Black | 50 | 2.7 | 0.2 | 0 | 4.8 | 10.1 | 2 | A | A |
| Ex. 9 | Silica | (1) | Color-less | 50 | 99.4 | 99.3 | 99 | 8.2 | 9.0 | 99 | C | A |

TABLE 2

| | Pigment | Polymer | Weather resistance of cover glass |
|---|---|---|---|
| Ex. 2 | Cobalt aluminum oxide | (1) | A |
| Ex. 10 | Cobalt aluminum oxide | (2) | C |
| Ex. 11 | Cobalt aluminum oxide | (3) | B |
| Ex. 12 | Cobalt aluminum oxide | (4) | D |

TABLE 3

| | Pigment | Polymer | $Fe_2O_3$ content in glass plate mass % | Power generation efficiency |
|---|---|---|---|---|
| Ex. 2 | Cobalt aluminum oxide | (1) | 0.1 | 33 |
| Ex. 13 | Cobalt aluminum oxide | (1) | 0.3 | 23 |

TABLE 4

| | | Layer | | | | | | | |
|---|---|---|---|---|---|---|---|---|---|
| | | Inorganic particles | | | | | | | |
| | | Composition | Maximum near infrared reflectance (%) | Average particle size (nm) | Specific surface area (m²/g) | Density (g/cm³) | L* | a* | b* | Layer thickness (μm) |
| Ex. 2 | | Cobalt aluminum oxide | 83.4 | 285.0 | 5.5 | 4.1 | 50.8 | 13.5 | −45.5 | 50 |
| Ex. 14 | | Cobalt aluminum oxide | 82.6 | 128.0 | 50.0 | 4.2 | 44.5 | 19.3 | −48.9 | 48 |
| Ex. 15 | | Cobalt aluminum oxide | 82.6 | 128.0 | 50.0 | 4.2 | 44.5 | 19.3 | −48.9 | 43 |
| | | Zirconium oxide | 82.6 | 131.0 | 11.9 | 5.7 | 100.0 | −0.4 | 1.1 | |

TABLE 4-continued

| | Cover glass | | | | | | |
|---|---|---|---|---|---|---|---|
| | Transmittance (%) | | Reflectance (%) | | Power | | Weather resistance |
| | Average near infrared | Average visible | Average visible | Maximum visible | generation efficiency | Rear side recognizability | of cover glass |
| Ex. 2 | 38.8 | 19.3 | 22.4 | 37.5 | 33 | A | A |
| Ex. 14 | 58.9 | 41.4 | 11.0 | 21.5 | 54 | B | A |
| Ex. 15 | 52.5 | 18.1 | 14.5 | 27.9 | 47 | A | A |

As shown in Table 1, the cover glass in each of Ex. 1 to 5, which had an average near infrared transmittance within a range of from 20 to 100%, was confirmed to be capable of forming a solar cell module excellent in the power generation efficiency. Further, since it had an average visible reflectance of from 10 to 100%, it was confirmed to have low rear side recognizability while being excellent in color development, and to be capable of forming a solar cell module excellent in the design.

Whereas the cover glass in each of Ex. 6 to 8, which had an average near infrared transmittance of less than 20%, was insufficient in the power generation efficiency. Further, the cover glass in Ex. 9, which had an average visible reflectance of less than 10%, was inferior in the design.

The cover glass in each of Ex. 2, 10 and 11, which was constituted by a layer containing a fluorinated polymer, was excellent in the weather resistance, whereas the cover glass in Ex. 12, which was not constituted by a layer containing a fluorinated polymer, was insufficient in the weather resistance.

Further, in a solar cell module comprising solar cells having high spectral sensitivity to infrared light, the proportion of the power generation amount by near infrared light to the total power generation amount is high. Accordingly, as shown in Table 3, by using glass having a low $Fe_2O_3$ content (particularly at most 0.3 mass %), absorption of near infrared light by $Fe_2O_3$ can be suppressed and as a result, the power generation efficiency improves, and such is suitable for a solar cell module comprising solar cells having high spectral sensitivity to infrared light.

As shown in Ex. 14 and 15, the cover glass using inorganic particles corresponding to the inorganic pigment N as the inorganic particles is suitable for a solar cell module in that the average near infrared transmittance improves.

Ex. 16

In Ex. 5, before application of the coating material to the glass plate, a silane coupling agent (3-isocyanatopropyltriethoxysilane) was applied by an applicator and dried at 120° C. for 12 hours to form a primer layer. Then, on the primer layer, the coating material was applied in the same manner as in Ex. 5 to obtain a cover glass.

Ex. 17

In the same manner as in Ex. 16 except that methyltriisocyanatosilane was used as the silane coupling agent, a cover glass was obtained.
(Warm Water Resistance)

The cover glass obtained in each of Ex. 5, 16 and 17 was dipped in warm water at 80° C. for 100 hours, and whether the functional layer was peeled from the substrate layer or not was visually confirmed, and evaluation was made based on the following standards. The results are shown in Table 5.

S: No peeling
A: A peeling area being at most 5%
B: A peeling area being at least 5%

TABLE 5

| Ex. | 5 | 16 | 17 |
|---|---|---|---|
| Warm water resistance | B | A | S |

As shown in Table 4, by using a silane coupling agent as the primer, the adhesion of the layer to the glass plate improved.

This application is a continuation of PCT Application No. PCT/JP2018/043278, filed on Nov. 22, 2018, which is based upon and claims the benefit of priority from Japanese Patent Application No. 2017-236991 filed on Dec. 11, 2017, Japanese Patent Application No. 2018-045508 filed on Mar. 13, 2018 and Japanese Patent Application No. 2018-045416 filed on Mar. 13, 2018. The contents of those applications are incorporated herein by reference in their entireties.

REFERENCE SYMBOLS

10: Solar cell module
12: Solar cell array
14: Cover glass
14A: First cover glass
14B: Second cover glass
16: Solar cell
16A: First light-receiving surface
16B: Second light-receiving surface
18: Encapsulant material
114A, 114B: Glass plate
214A, 214B: Layer

What is claimed is:

1. A cover glass comprising a glass plate and a layer covering at least one surface of the glass plate, the layer containing a fluorinated polymer having units based on a fluoroolefin and particles consisting of one or more inorganic metal oxide pigments,
wherein a $Fe_2O_3$ content determined as a content of total iron contained in the glass plate as calculated as $Fe_2O_3$ is from 0 to 0.3 mass % relative to the total mass of the glass plate,
the particles of the one or more inorganic metal oxide pigments have a maximum near infrared reflectance in a near infrared region at a wavelength of from 780 to 1,500 nm of at least 50%, the cover glass has an average visible reflectance of from 10 to 100%, which is an arithmetic mean of reflectances at 5 nm intervals in a visible region at a wavelength of from 380 to 780 nm, and the cover glass has an average near infrared transmittance of from 20 to 100%, which is an arithmetic mean of transmittances at 5 nm intervals in a near infrared region at a wavelength of from 780 to 1,500 nm.

2. The cover glass according to claim 1, which has an average visible transmittance of less than 70%, which is an arithmetic mean of transmittances at 5 nm intervals in a visible region at a wavelength of from 380 to 780 nm.

3. The cover glass according to claim 1, which has a maximum reflectance of from 20 to 100% among reflectances at 5 nm intervals in a visible region at a wavelength of from 380 to 780 nm.

4. The cover glass according to claim 1, wherein the glass plate contains no $Fe_2O_3$.

5. The cover glass according to claim 1, wherein a content of the particles consisting of one or more inorganic metal oxide pigments is from 10 to 1,000 parts by mass per 100 parts by mass of the fluorinated polymer.

6. The cover glass according to claim 1, wherein an average particle size of the particles consisting of one or more inorganic metal oxide pigments is from 5.0 to 280.0 nm and a specific surface area of from 5.0 to 1,000 $m^2/g$.

7. The cover glass according to claim 1, wherein the one or more inorganic metal oxide pigment has in the L*a*b* color space an L* value of from 5 to 100, an a* value of from −60 to 60, and a b* value of from −60 to 60.

8. The cover glass according to claim 1, wherein the fluorinated polymer has a fluorine atom content of from 15 to 30 mass %.

9. The cover glass according to claim 1, wherein the fluorinated polymer is a fluorinated polymer having a crosslinked structure formed by reaction of a copolymer having units based on a fluoroolefin and units having a crosslinkable group, and a curing agent capable of crosslinking crosslinkable groups, and the curing agent is a compound having in one molecule at least two groups of at least one type selected from the group consisting of an isocyanate group, a blocked isocyanate group, an epoxy group, a carbodiimide group, an oxazoline group, a β-hydroxyalkylamide group, a hydrolysable silyl group and a silanol group.

10. A solar cell module, comprising solar cells and a cover glass on a light-receiving surface side of the solar cells; wherein the cover glass comprises:

a glass plate; and a layer of a fluorinated polymer having units based on a fluoroolefin and particles consisting of one or more inorganic metal oxide pigments covering at least one surface of the glass plate;

wherein the cover glass has an average visible reflectance of from 10 to 100%, which is an arithmetic mean of reflectances at 5 nm intervals in a visible region at a wavelength of from 380 to 780 nm, the cover glass has an average near infrared transmittance of from 20 to 100%, which is an arithmetic mean of transmittances at 5 nm intervals in a near infrared region at a wavelength of from 780 to 1,500 nm, a $Fe_2O_3$ content determined as a content of total iron contained in the glass plate as calculated as $Fe_2O_3$ is from 0 to 0.3 mass % relative to the total mass of the glass plate, and the particles consisting of one or more inorganic metal oxide pigments have a maximum near infrared reflectance in a near infrared region at a wavelength of from 780 to 1,500 nm of at least 50%.

11. An outer wall material for building, comprising the solar cell module defined in claim 10.

12. The solar cell module according to claim 10, wherein an average visible transmittance of the cover glass is less than 70%, determined as an arithmetic mean of transmittances at 5 nm intervals in a visible region at a wavelength of from 380 to 780 nm.

13. The solar cell module according to claim 10, wherein a maximum reflectance of the cover glass is from 20 to 100% among reflectances at 5 nm intervals in a visible region at a wavelength of from 380 to 780 nm.

14. The solar cell module according to claim 10, wherein the glass plate contains no $Fe_2O_3$.

15. The solar cell module according to claim 10, wherein a content of the particles consisting of one or more inorganic metal oxide pigments in the layer of a fluorinated polymer is from 10 to 1,000 parts by mass per 100 parts by mass of the fluorinated polymer.

16. The solar cell module according to claim 10, wherein an average particle size of the particles consisting of one or more inorganic metal oxide pigments is from 5.0 to 280.0 am and a specific surface area of the inorganic particles is from 5.0 to 1,000 $m^1/g$.

17. The solar cell module according to claim 10, wherein the one or more inorganic metal oxide pigment has in the L*a*b* color space an L* value of from 5 to 100, an a* value of from −60 to 60, and a b* value of from −60 to 60.

18. The solar cell module according to claim 10, wherein a fluorine atom content of the fluorinated polymer is from 15 to 30 mass %.

19. The solar cell module according to claim 10, wherein the fluorinated polymer is a fluorinated polymer having a crosslinked structure formed by, reaction of a copolymer having units based on a fluoroolefin and units having a crosslinkable group, and a curing agent capable of crosslinking the crosslinkable groups, and the curing agent is a compound having in one molecule at least two groups of at least one type selected from the group consisting of an isocyanate group, a blocked isocyanate group, an epoxy group, a carbodiimide group, an oxazoline group, a β-hydroxyalkylamide group, a hydrolysable silyl group and a silanol group.

* * * * *